United States Patent
Sabde et al.

(10) Patent No.: US 9,530,514 B1
(45) Date of Patent: Dec. 27, 2016

(54) SELECT GATE DEFECT DETECTION

(71) Applicant: SanDisk Technologies Inc., Plano, TX (US)

(72) Inventors: Jagdish Sabde, Fremont, CA (US); Jayavel Pachamuthu, San Jose, CA (US); Sagar Magia, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/005,487

(22) Filed: Jan. 25, 2016

(51) Int. Cl.
  *G11C 29/00*  (2006.01)
  *G11C 16/34*  (2006.01)
  *G11C 16/04*  (2006.01)
  *G11C 16/12*  (2006.01)
  *G11C 29/04*  (2006.01)

(52) U.S. Cl.
  CPC .......... *G11C 16/3404* (2013.01); *G11C 16/04* (2013.01); *G11C 16/12* (2013.01); *G11C 29/04* (2013.01)

(58) Field of Classification Search
  USPC .............. 365/201, 200, 189.09, 230.06
  See application file for complete search history.

(56) References Cited

U.S. PATENT DOCUMENTS

| | | |
|---|---|---|
| 8,902,657 B2 | 12/2014 | Iwai et al. |
| 9,105,349 B2 | 8/2015 | Avila et al. |
| 9,152,497 B2 | 10/2015 | Lee et al. |
| 2011/0049636 A1* | 3/2011 | Ooike ............ H01L 27/11521 257/368 |

\* cited by examiner

*Primary Examiner* — Vu Le
(74) *Attorney, Agent, or Firm* — Vierra Magen Marcus LLP

(57) ABSTRACT

Detecting defects in select gates of memory cell strings is disclosed. An electrical short between adjacent select gates may be detected. The select gate may comprises a transistor having an adjustable threshold voltage. An operation configured to change a threshold voltage of one select transistor and to maintain a threshold voltage of an adjacent select transistor may be performed. The select transistors may be flagged in response to the threshold voltage of either select transistor failing to meet a target threshold voltage in response to the operation. The operation may be an erase operation or a program operation.

20 Claims, 17 Drawing Sheets

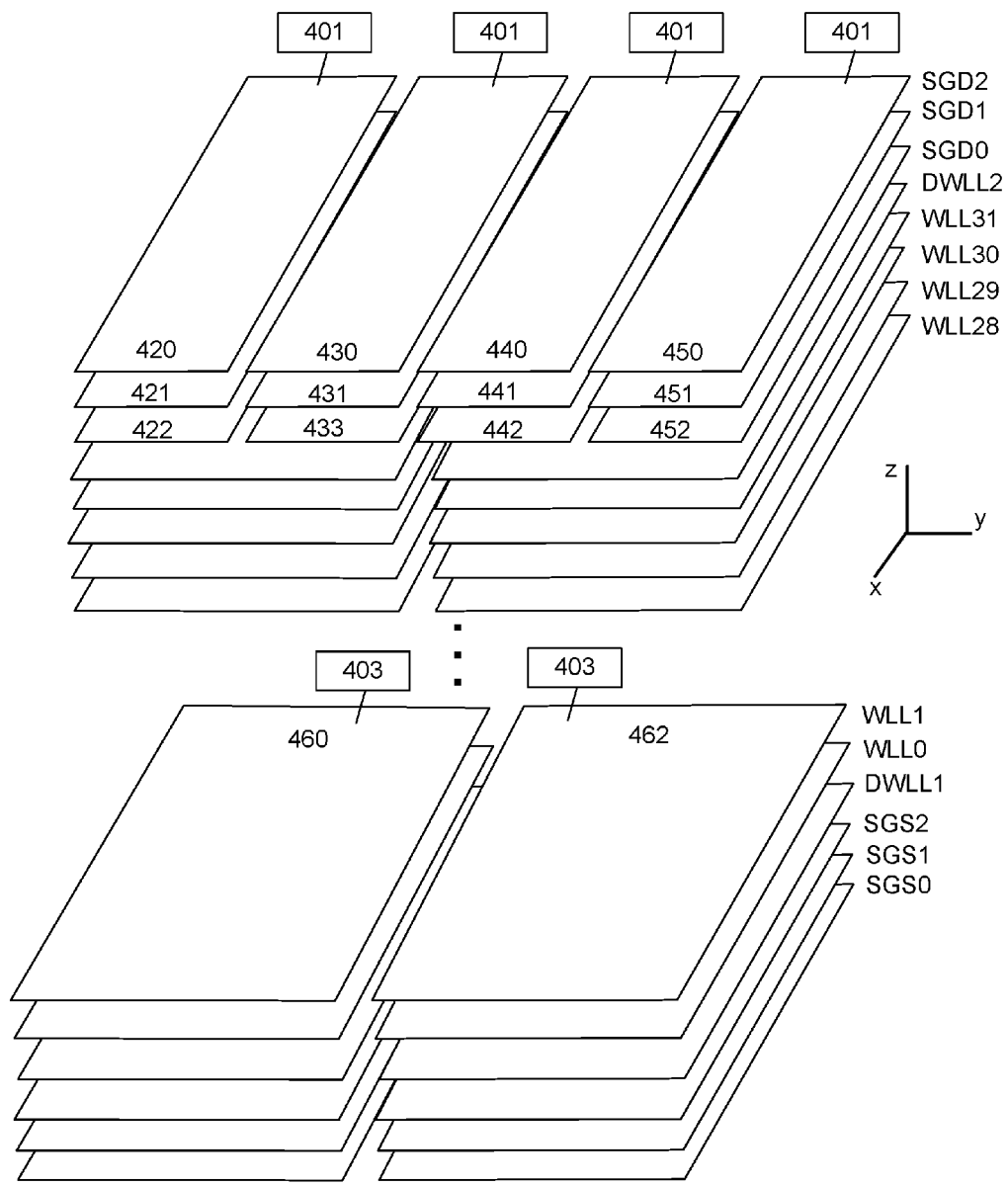
Figure 4C1

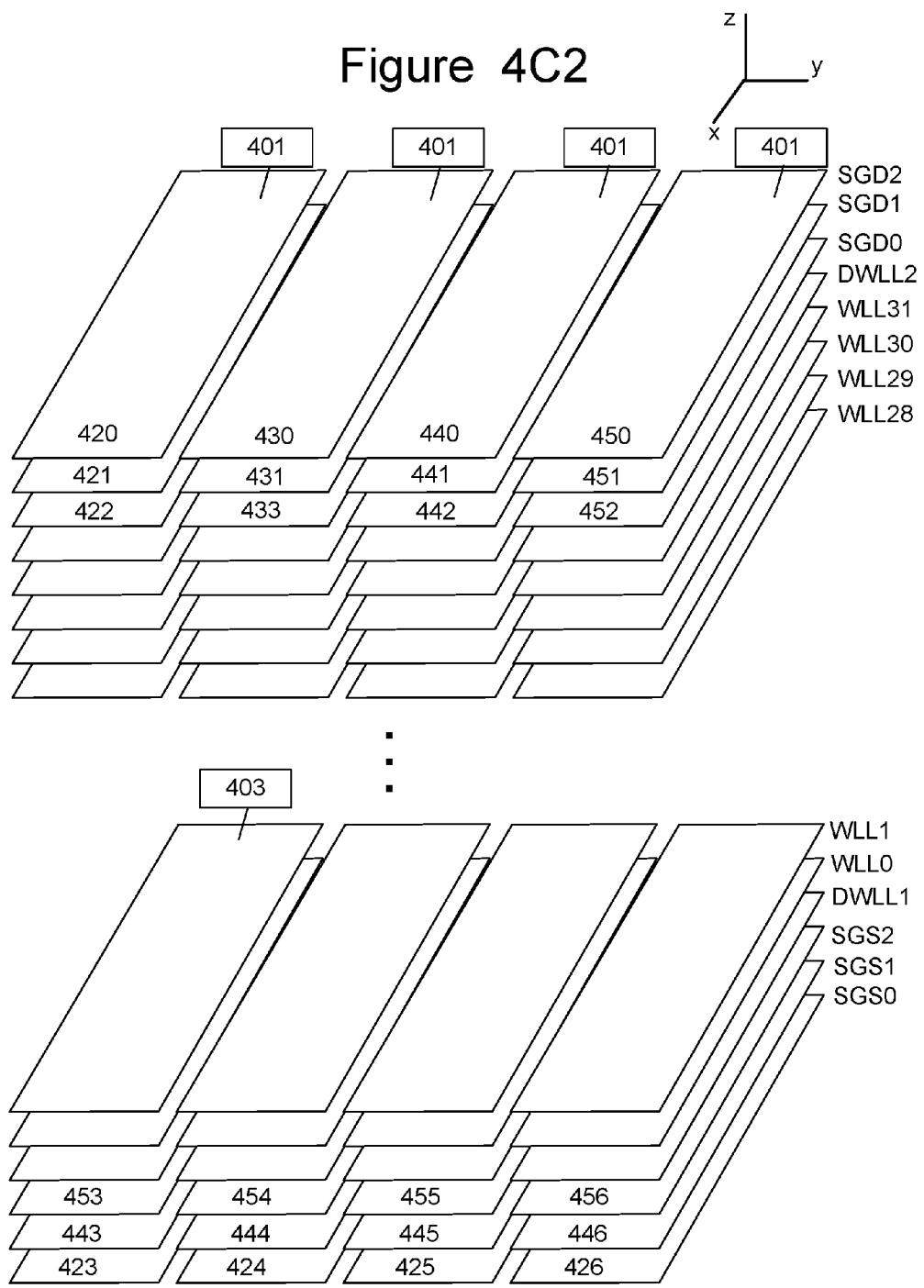

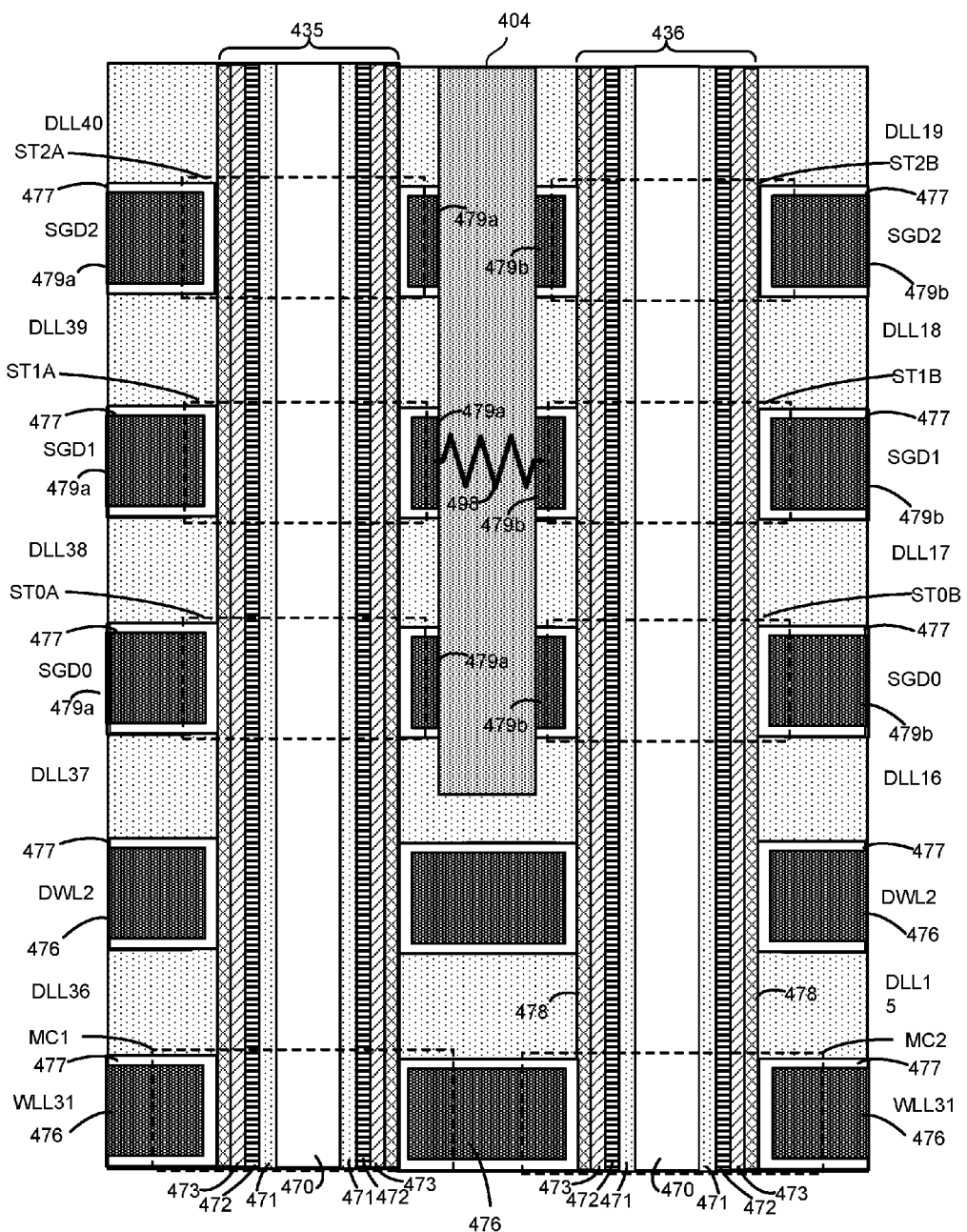
Figure 4D1

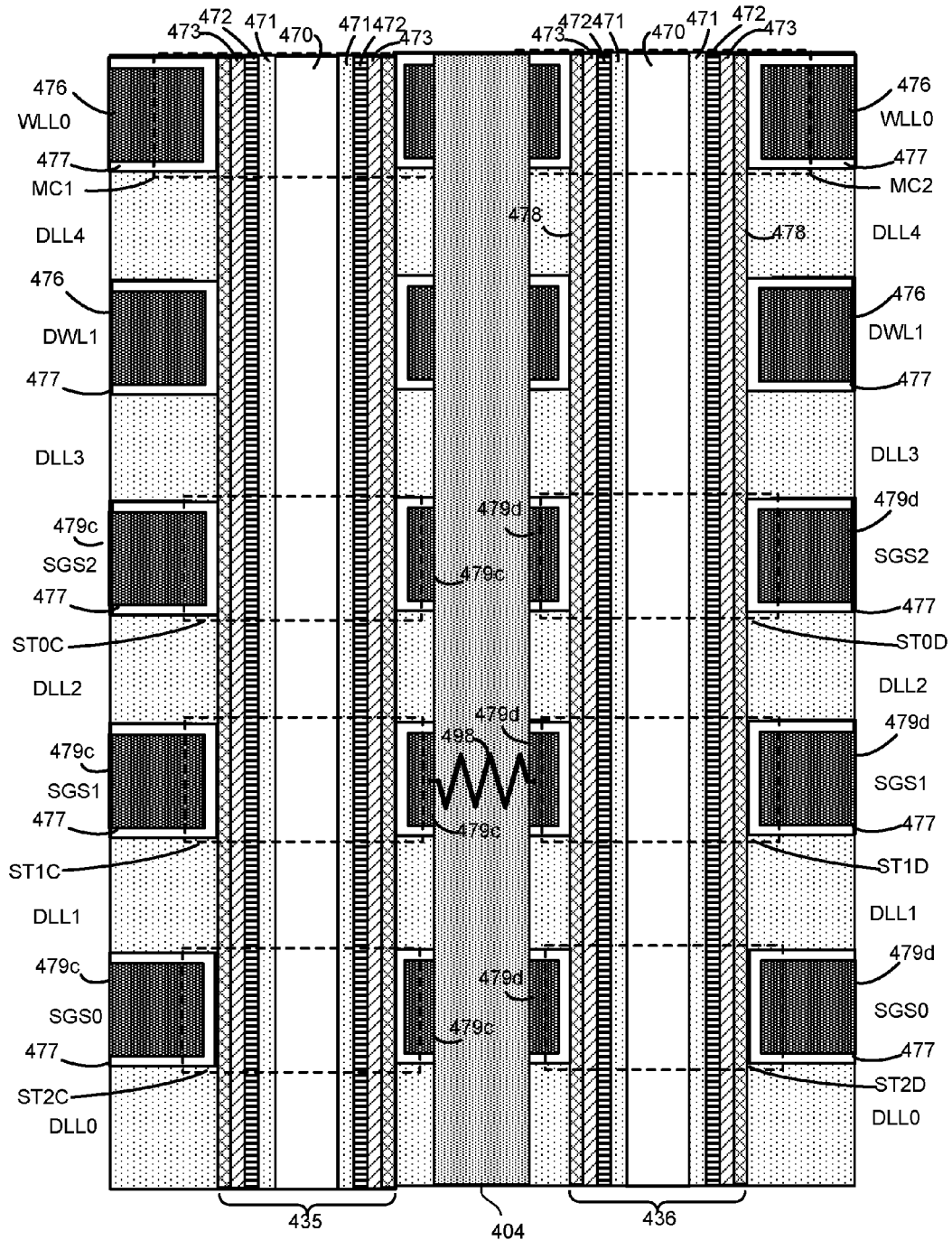
Figure 4D2

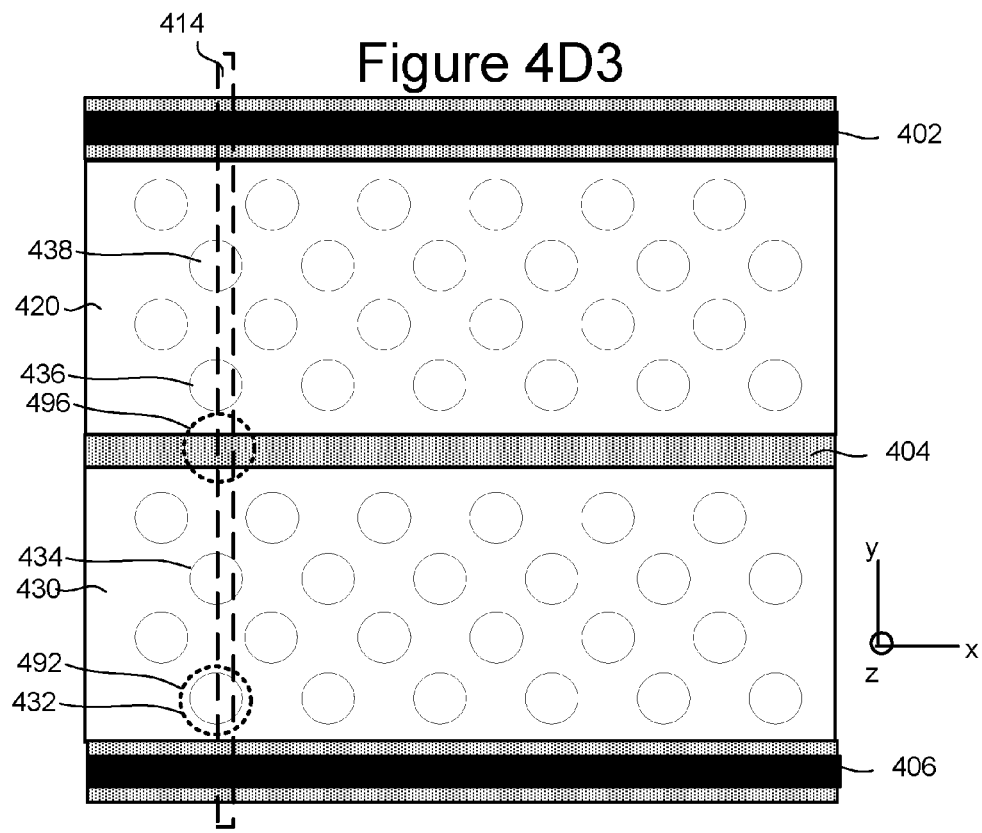
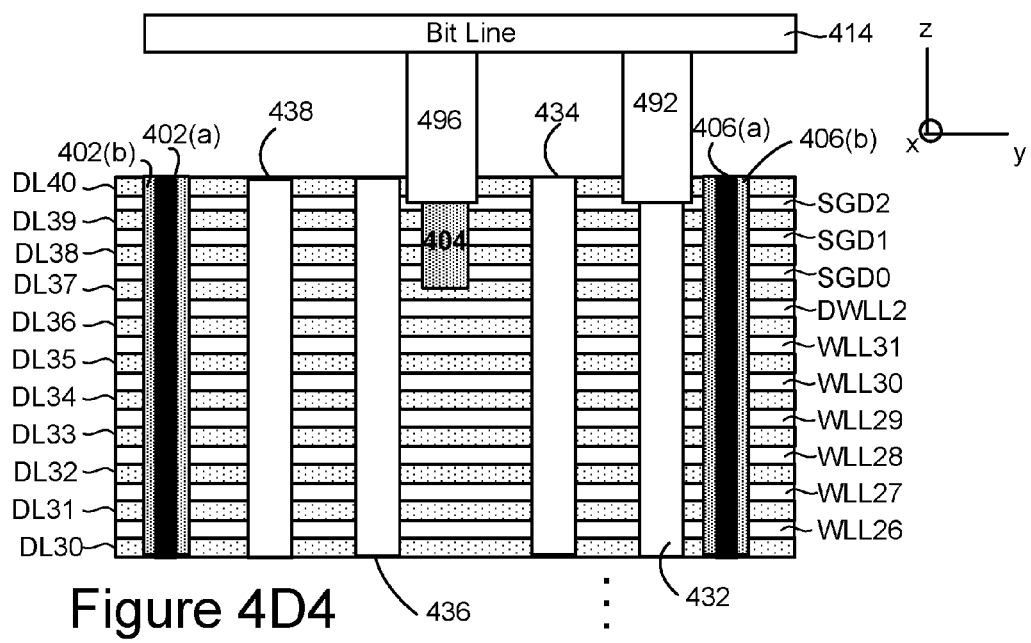

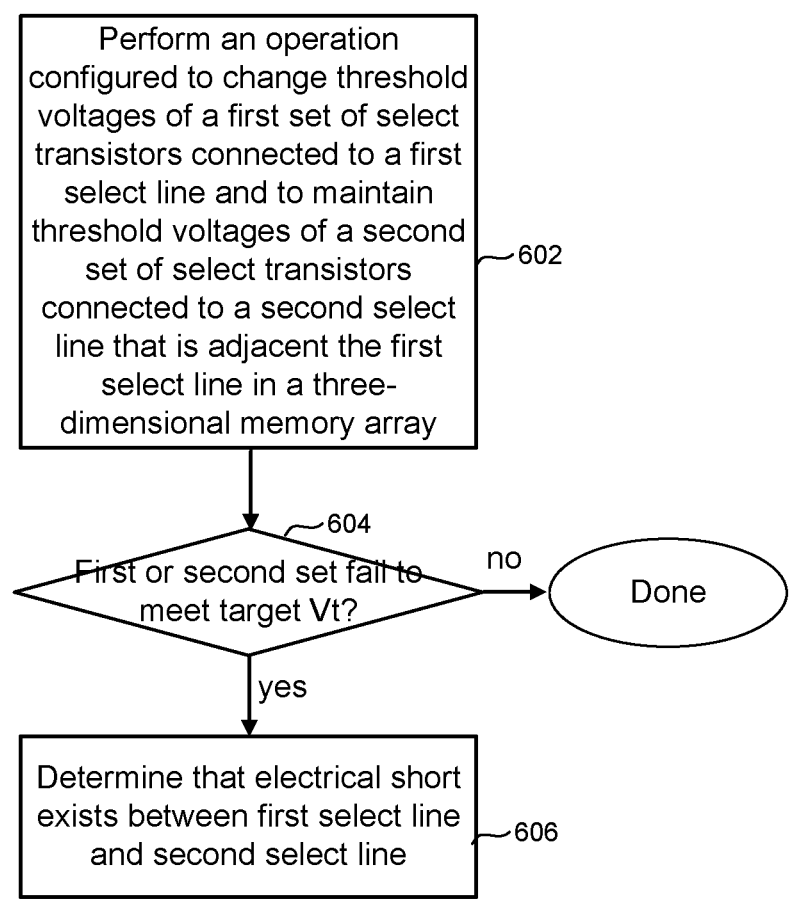

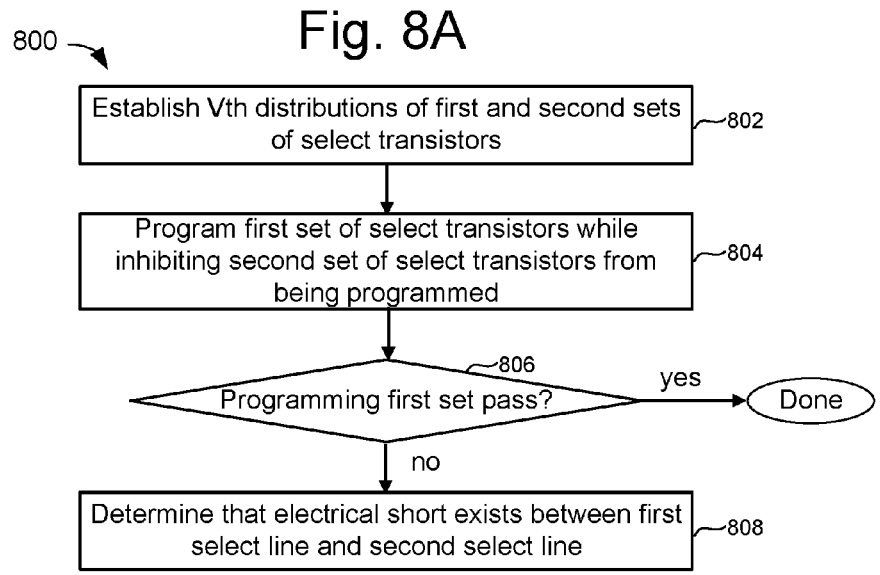
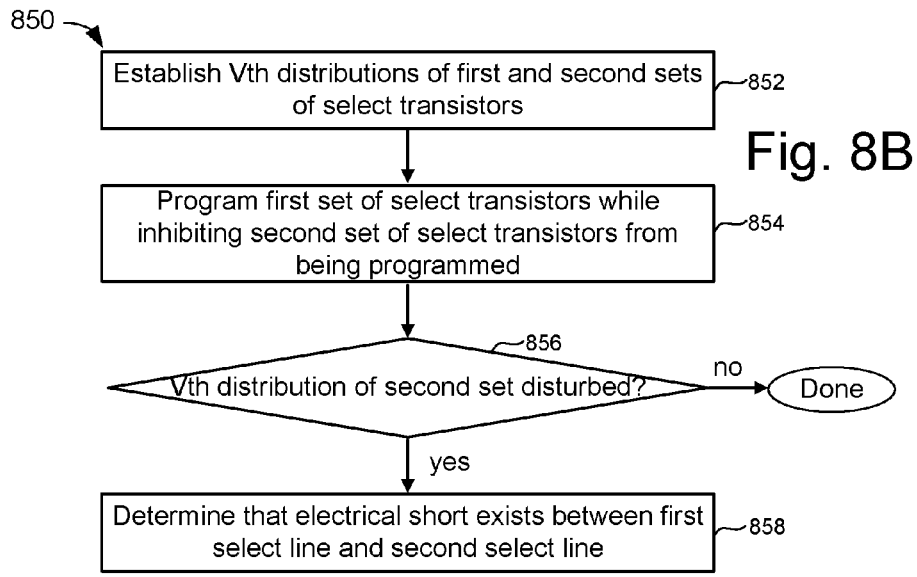

SELECT GATE DEFECT DETECTION

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

In one architecture, a string of memory cells has a select gate at each end of the string. The select gate is used to switchably connect the string to/from a conductive line such as a bit line or source line. A select line may connect to the select gate of many different strings. For example, a drain side select line may connect to drain side select gates at one end of the strings and a source side select line may connect to source side select gates at the other end of the strings. It is possible for there to be an electrical short between two adjacent select lines. In this case, operation of the strings of memory cells is impaired.

BRIEF DESCRIPTION OF THE DRAWINGS

Like-numbered elements refer to common components in the different figures.

FIG. 4C1 depicts a perspective view of one embodiment of the conductive layers for the block depicted in FIG. 4B.

FIG. 4C2 depicts a perspective view of another embodiment of the conductive layers for the block depicted in FIG. 4B.

FIG. 4D1 depicts a portion of an embodiment of three dimensional memory structure 126 showing a cross-sectional view along line BB of FIG. 4A.

FIG. 4D2 is a diagram one embodiment of a portion of three dimensional memory structure.

FIGS. 4D3 and 4D4 depict one example of an electrical short for one embodiment of a memory structure.

FIG. 6 is a flowchart of one embodiment of a process for determining whether an electrical short exists between two adjacent select lines.

FIG. 8A is a flowchart of one embodiment of a process that uses a program operation when determining whether an electrical short exists between adjacent select lines.

FIG. 8B is a flowchart of another embodiment of a process of determining whether an electrical short exists between adjacent select lines that involves using a program operation.

FIG. 8C depicts an example Vth distribution, which shows erase disturb.

DETAILED DESCRIPTION

Figure 1:
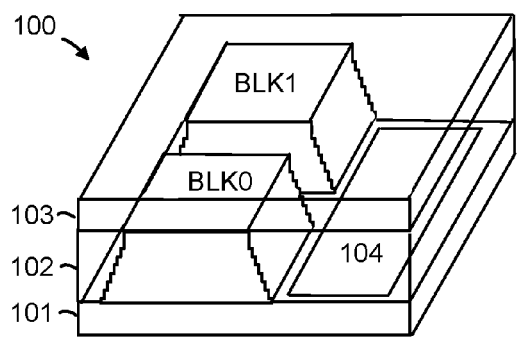
FIG. 1 is a perspective view of a 3D stacked non-volatile memory device.

The present disclosure is directed to detecting defects in select gates of memory cell strings. One example is to detect that an electrical short exists between adjacent select gates The select gates may be on adjacent NAND strings. The select gate comprises a transistor, in one embodiment. The transistor has an adjustable threshold voltage, in one embodiment.

In one embodiment, an operation configured to change a threshold voltage of one select transistor and to maintain a threshold voltage of an adjacent select transistor is performed. The select transistors may be flagged in response to the threshold voltage of either select transistor failing to meet a target threshold voltage in response to the operation.

In one embodiment, the operation is an erase operation. In one embodiment, an apparatus is configured to apply an erase enable voltage to a gate of one select transistor while attempting to float the voltage at a gate of an adjacent select transistor. If there is an electrical short between the two select transistors, then the voltage at the gate of the adjacent select transistor may move close to the erase enable voltage. Consequently, the adjacent select transistor may be erased, or partially erased. As one example, the threshold voltage of the adjacent select transistor may be moved lower. Thus, a defect such as an electrical short can be detected in response to the erase operation lowering the threshold voltage of the adjacent select transistor.

In one embodiment, the operation is a program operation. In one embodiment, an apparatus is configured to apply a program voltage to a gate of a first select transistor while applying a voltage lower than the program voltage to the gate of a second select transistor that is adjacent to the first select transistor. If there is an electrical short between the two gates, it may be that the program voltage at the gate of the first select transistor is pulled down to some extent. This could cause the program operation of the first select transistor to fail. In one embodiment, an electrical short between the two select transistors is detected in response to the program operation on the first select transistor failing.

In another embodiment in which the operation is a program operation, the apparatus is configured to attempt to float the voltage at the gate of the second select transistor, while applying a program voltage to the gate of the first select transistor. Floating the voltage at the gate of the second select transistor is intended to inhibit programming. However, if there is an electrical short between the gates of the two select transistors, the gate of the second select transistor may raise to the program voltage, or at least sufficiently close to the program voltage to cause program disturb.

Note that the same circuitry that tests threshold voltages of memory cells can be used to measure threshold voltages of the select transistors. This avoids the need for specialized circuitry to measure leakage currents between the select transistors. Also note that the foregoing tests may be performed in the field. Thus, the tests could be performed prior to programming the memory cells. This can help to prevent data loss, which could occur if defects are not detected prior to programming the memory cells.

In one embodiment, a stress is applied to the select transistors prior to performing a test to detect a defect of the select transistors. For example, a relatively high magnitude voltage can be applied to the gate of one select transistor while applying a lower magnitude voltage to the gate of an adjacent select transistor. The stress can help to bring out an electrical short that would not otherwise be detected. The high and low magnitude voltages can be alternated to provide even more stress. This can help to bring out a defect that is not severe enough at the time of programming the memory cells to result in data loss, but which could become severe enough sometime after programming the memory cells to result in data loss. Thus, such data loss can be prevented.

The embodiments of the disclosure can be practiced in various structures including a multilevel memory structure, non-limiting examples of which include semiconductor devices such as three-dimensional monolithic memory array devices comprising a plurality of NAND memory strings.

The following discussion provides details of one example of a suitable structure in which embodiments may be practiced.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
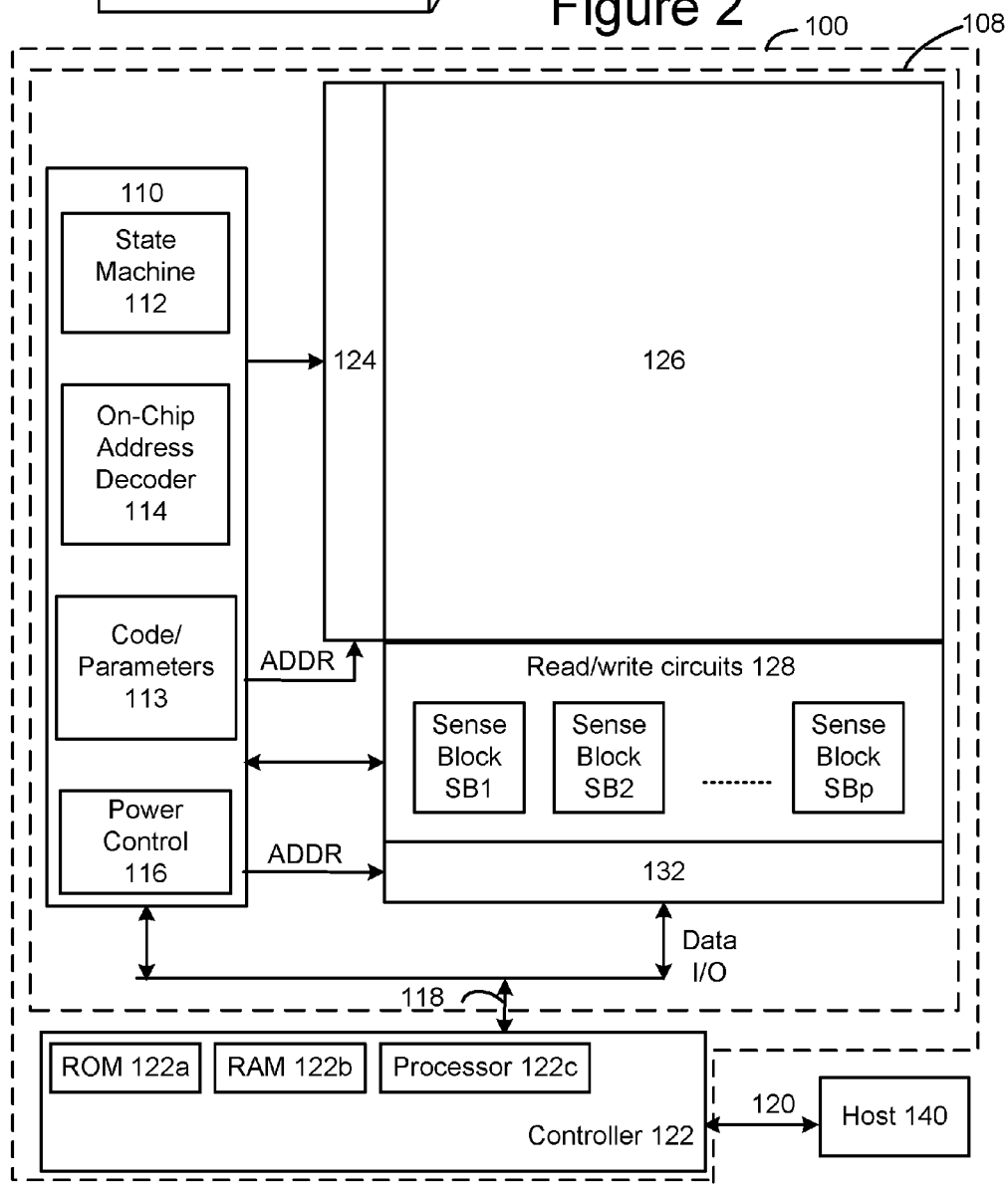
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. Memory device 100 includes one or more memory die 108. Each memory die 108 includes a three dimensional memory structure 126 of memory cells (such as, for example, a 3D array of memory cells), control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, storage 113, power control module 116, sense blocks SB1, SB2, . . . , SBp, read/write circuits 128, and controller 122 can be considered a managing circuit that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3:
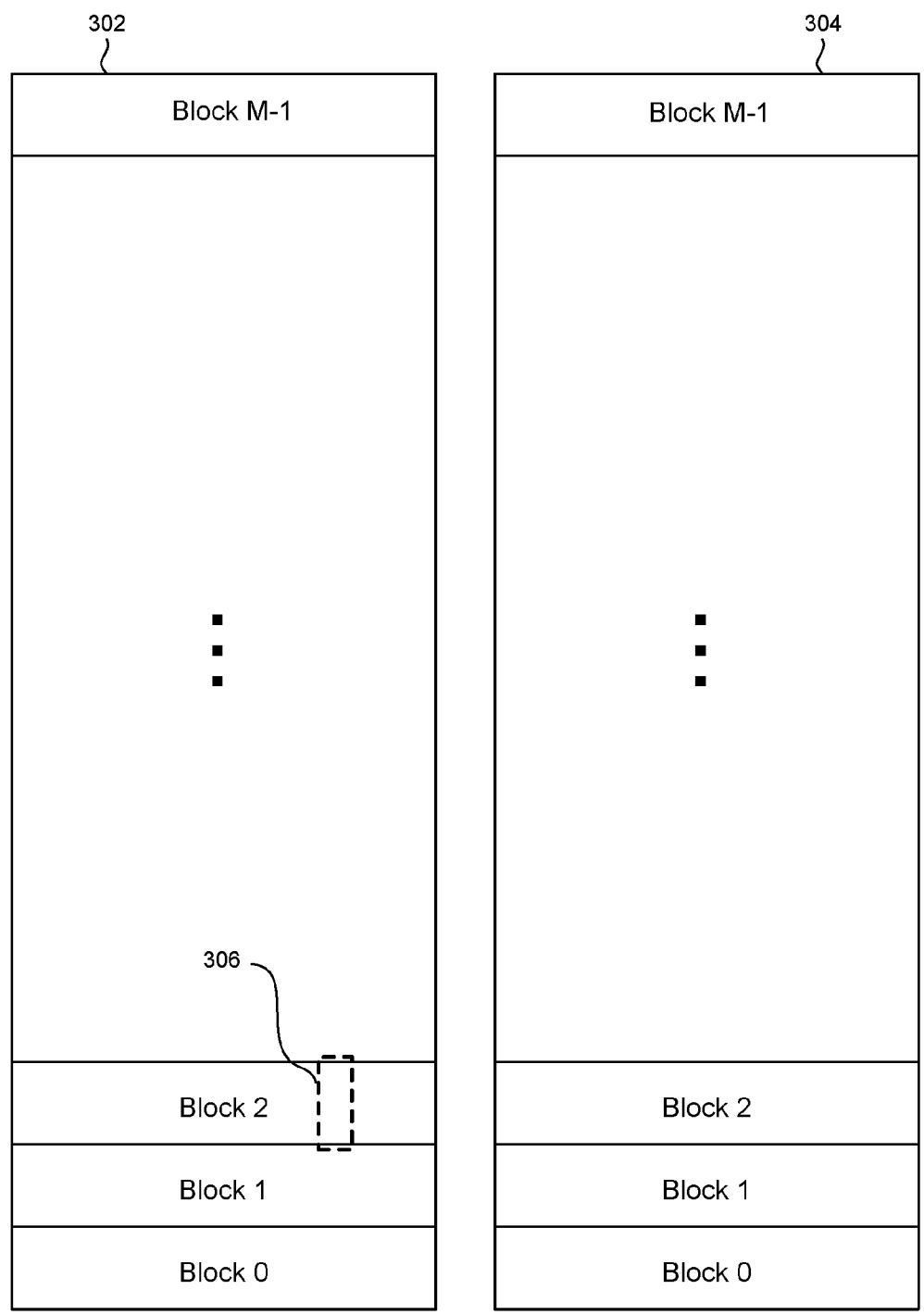
FIG. 3 is a block diagram of a memory structure having two planes.

FIG. 3 is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4A:
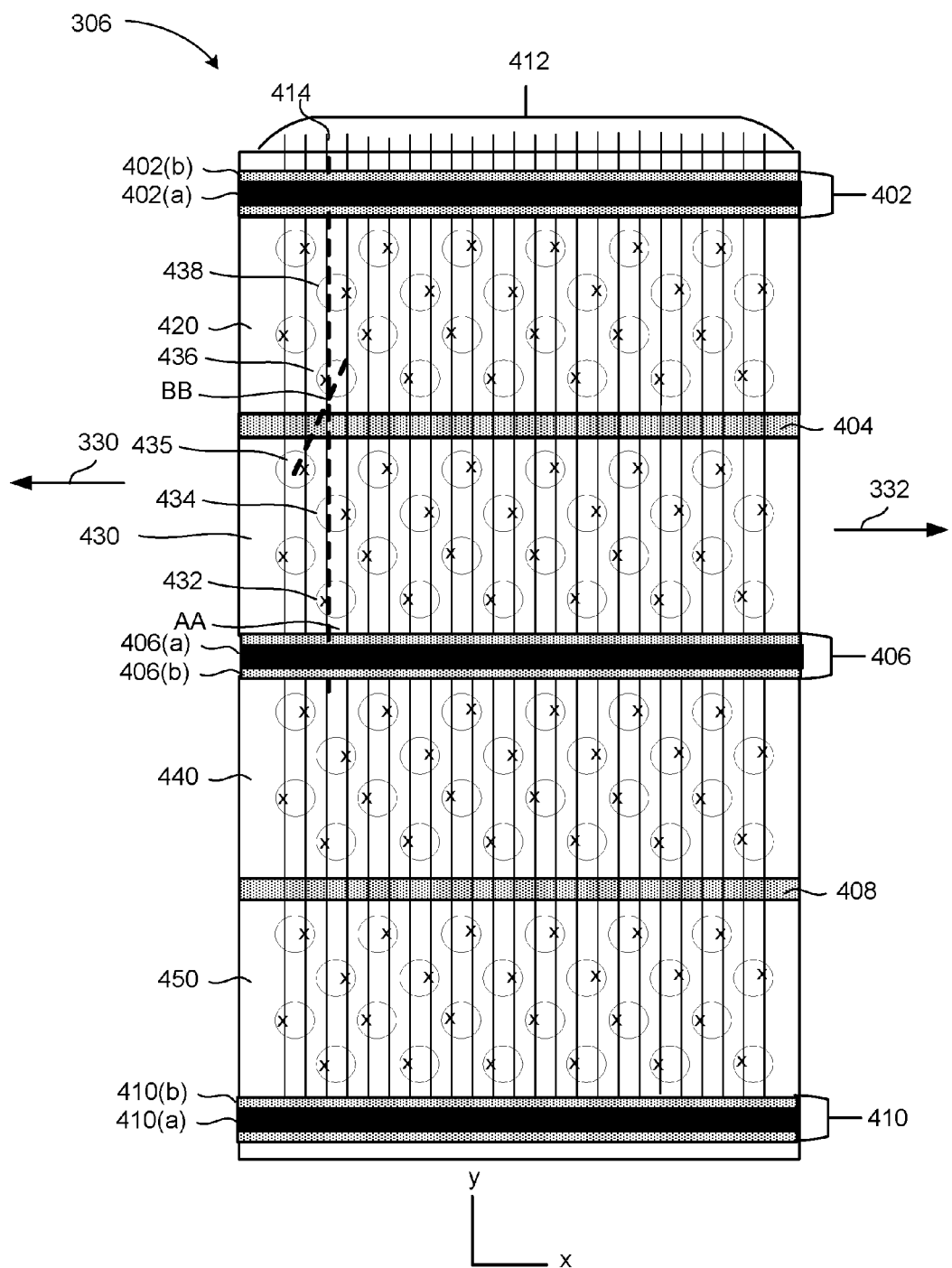
FIG. 4A depicts a top view of a portion of a block of memory cells.

FIG. 4A is a block diagram depicting a top view of a portion of one block from memory structure 126. The portion of the block depicted in FIG. 4A corresponds to portion 306 in block 2 of FIG. 3. As can be seen from FIG. 4A, the block depicted in FIG. 4A extends in the direction of arrow 330 and in the direction of arrow 332. In one embodiment, the memory array will have 48 layers. Other embodiments have less than or more than 48 layers. However, FIG. 4A only shows the top layer.

FIG. 4A depicts a plurality of circles that represent the vertical columns. Each of the vertical columns include multiple select transistors and multiple memory cells, in one embodiment. In one embodiment, each vertical column implements a NAND string. More details of the vertical columns are provided below. Since the block depicted in FIG. 4A extends in the direction of arrow 330 and in the direction of arrow 332, the block includes more vertical columns than depicted in FIG. 4A.

FIG. 4A also depicts a set of bit lines 412. FIG. 4A shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4A includes a set of local interconnects 402, 406, and 410 that connect the various layers to a source line below the vertical columns. Each local interconnect has a central conductive region (402(*a*), 406(*a*), 410(*a*)) and an outer insulating region (402(*b*), 406(*b*), 410(*b*)).

The block depicted in FIG. 4A includes select gate separators 404, 408. In one embodiment, select gate separators 404, 408 are formed from an insulator such as, for example, silicon oxide. The local interconnects 402, 406, and 410, and the select gate separators 404, 408 serve to divide the top layer into regions 420, 430, 440 and 450. Each region 420, 430, 440 and 450 serves as one select gate line, in one embodiment. Each region 420, 430, 440 and 450 may be formed from a conductor, such as tungsten.

Figure 4B:
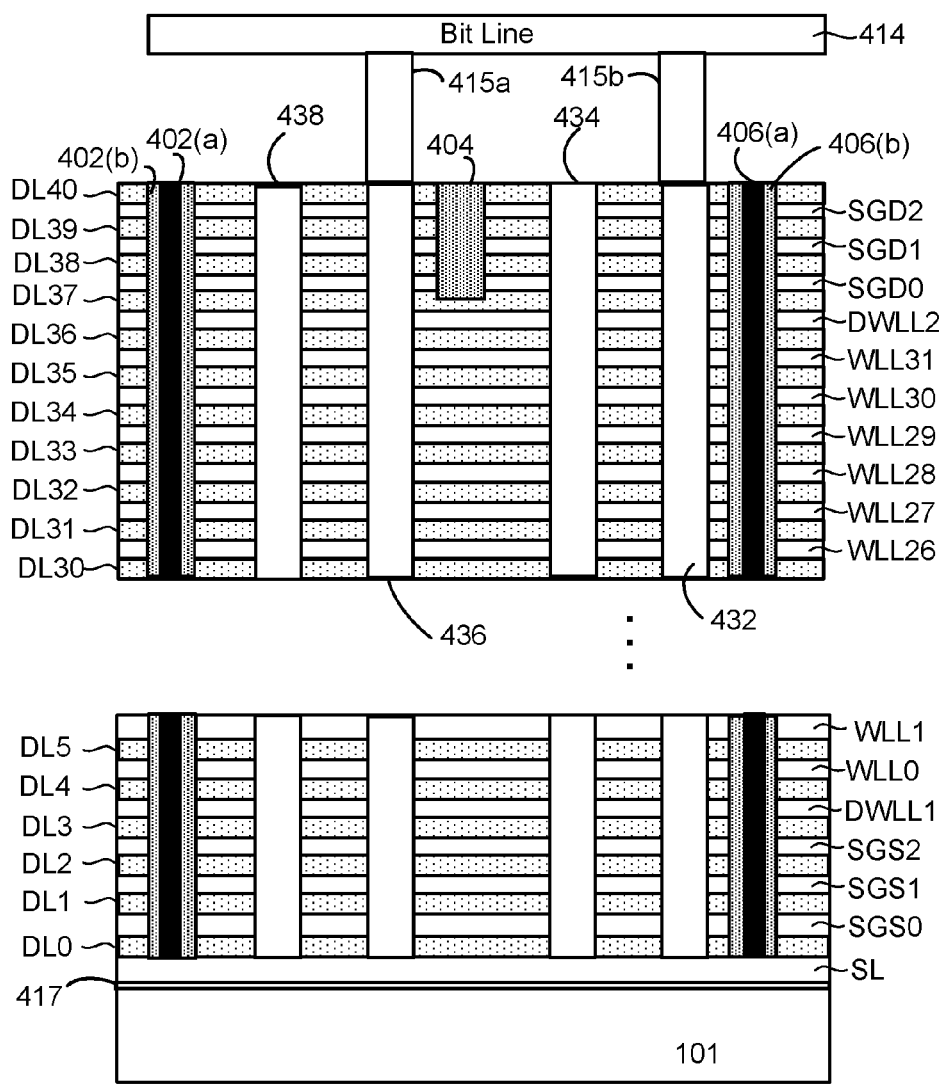
FIG. 4B depicts a cross sectional view of a portion of a block of memory cells.

FIG. 4B depicts a portion of an embodiment of three dimensional memory structure 126 showing a cross-sectional view along line AA of FIG. 4A. This cross sectional view cuts through vertical columns 432, 434, 436, and 438; regions 420 and 430; local interconnects 402, 406; and select gate separator 404 (see FIG. 4A). Referring briefly to FIG. 4B, local interconnects 402 and 406 are depicted as extending down to the source line (SL). However, select gate separator 404 only extends downward partway into DL37. Optionally, select gate separator 404 could extend down to the source line (SL), similar to the local interconnects 402, 406.

Thus, if the select gate separator 404 only extends downward partway into DL37 the block is divided into four select lines. However, the layers of the block that implement memory cells, have just two regions instead of four. The two regions are referred to as word line fingers that are separated by the local interconnects. In one embodiment, the word line fingers on a common level of a block connect together at the end of the block to form a single word line. In another embodiment, the word line fingers on the same level are not connected together. In one embodiment, the select gate separators 404, 408 extend down to the source line. In this case, there are four word line fingers in the block.

Referring now again to FIG. 4A, in one example implementation, a bit line only connects to one vertical column in each of regions 420, 430, 440 and 450. In that implementation, each block has sixteen rows (each row extending in the x-direction) of active columns and each bit line connects to four rows in each block. In one embodiment, all of four rows connected to a common bit line are connected to the same word line (possibly via different word line fingers on the same level that are connected together). Therefore, the system may use the drain side select lines to choose one (or another subset) of the four to be subjected to a memory operation (program, verify, read, and/or erase).

Although FIG. 4A shows four regions (420, 430, 440, 450), each region (e.g., region 420) having four rows of vertical columns, and sixteen rows of vertical columns in a block, those exact numbers are an example implementation. Other embodiments may include more or fewer regions per block, more or fewer rows of vertical columns per region and more or fewer rows of vertical columns per block.

FIG. 4A also shows the vertical columns being staggered. In other embodiments, different patterns of staggering can be used. In some embodiments, the vertical columns are not staggered.

Referring again to FIG. 4B, the structure includes three drain side select layers SGD0, SGD1, and SGD2; three source side select layers SGS0, SGS1 and SGS2; two dummy word line layers DWLL1, DWLL2; and thirty two word line layers WLL0-WLL31 for connecting to data memory cells (WLL2-WLL25 not depicted in FIG. 4B). Other embodiments can implement more or fewer than three drain side select layers, more or fewer than three source side select layers, more or fewer than two dummy word line layers, and more or fewer than thirty two word line layers. Vertical columns 432, 434, 436, 438 are depicted protruding through the drain side select layers, source side select layers, dummy word line layers and word line layers. In one embodiment, each vertical column comprises a NAND string. Below the vertical columns and the layers listed below is substrate 101, an insulating film 417 on the substrate, and source line SL. The NAND string of vertical column 432 has a source end at a bottom of the stack and a drain end at a top of the stack. As in agreement with FIG. 4A, FIG. 4B show vertical columns 432 and 436 connected to Bit Line 414 via connectors 415a, 415b. Local interconnect 402 and 406 are also depicted. Moreover, select gate separator 404 is depicted.

For ease of reference, drain side select layers SGD0, SGD1 and SGD2; source side select layers SGS0, SGS1 and SGS2; dummy word line layers DWLL1, DWLL2; and word line layers WLL0-WLL31 collectively are referred to as the conductive layers. In one embodiment, the conductive layers are made from a combination of TiN and tungsten. In this example, the TiN serves as a conductive barrier metal. In other embodiments, instead of TiN, other materials can be used to form the conductive barrier metal, such as tungsten nitride, tantalum nitride or metallic nitride alloys. In other embodiments, other materials can be used to form all or part of the conductive layers, such as doped polysilicon, metal silicide or metallic alloys. In some embodiments, different conductive layers can be formed from different materials. Between conductive layers are dielectric layers DL0-DL40 (DL6-DL30 not depicted in FIG. 4B). For example, dielectric layers DL31 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1, DWLL2 connect to dummy memory cells. A dummy memory cell, also referred to as a non-data memory cell, does not store user data, while a data memory cell is eligible to store user data. Thus, data memory cells may be programmed. Drain side select layers SGD0, SGD1 and SGD2 are used to electrically connect and disconnect NAND strings from bit lines. Source side select layers SGS0, SGS1 and SGS2 are used to electrically connect and disconnect NAND strings from the source line SL.

FIG. 4C1 depicts a perspective view of the conductive layers (SGS0, SGS1, SGS2; DWLL1, WLL0-WLL31, DWLL2, SGD0, SGD1, SGD2) for the block that is partially depicted in FIG. 4B. As mentioned above with respect to FIG. 4A, local interconnects 402, 406, and 410, in combination with select gate separators 404 and 408 break up the conductive layers for drain side select gates (e.g., SGD0, SGD1, SGD2) into four regions. For example, drain side select gate layer SGD2 (the top layer) is divided into regions 420, 430, 440 and 450. Similarly, select gate layer SGD1 is divided into regions 421, 431, 441, and 451; and select gate layer SGD0 is divided into regions 422, 433, 442, and 452. Each of these aforementioned regions can be referred to as a select line. Thus, SGD2 layer has drain side select lines 420, 430, 440, and 450; SGD1 layer has drain side select lines 421, 431, 441, and 451; and SGD0 layer has drain side select lines 422, 433, 442, and 452.

Note that the four regions at a given drain side select gate layer are not electrically connected to one another, in one embodiment. This allows for separate selection of NAND strings in the four regions. However, as will be discussed more fully below, there could be an electrical short between two adjacent regions. For example there might be an electrical short between regions 420 and 430; regions 440 and 450; regions 421 and 431; regions 441 and 451; regions 422 and 433; and/or regions 442 and 452. Other electrical shorts involving these regions are also possible. Such electrical shorts may impair memory operations. Such electrical shorts may even result in data loss due to, for example, unintentional erasure or unintentional programming. Embodiments, disclosed herein detect electrical shorts including, but not limited to, the foregoing examples.

In the embodiment depicted in FIG. 4C1, the other conductive layers are divided into two regions. For example, WLL1 is divided into regions 460 and 462. Likewise, conductive layers SGS0, SGS1, SGS2, DWLL1, WLL0, WLL28-WLL31, and DWLL2 (as well as other word line layers not depicted in FIG. 4C1) are divided into two regions. For word line layers (WLL0-WLL-31), the regions are referred to as word line fingers. For example, word line layer WLL1 is divided into word line fingers 460 and 462. Note that the two word line fingers in a given layer (e.g., WLL1) may be electrically connected at one or both ends. Note that for the source line layers (SGS0, SGS1, SGS2), the two regions may or may not be electrically connected.

As already noted, layers SGS0, SGS1, SGS2, DWLL1, WLL0-WLL31, and DWLL2 could be divided into four regions instead. Thus, note that one option is to have four separate regions for the source line regions SGS0, SGS1, SGS2. If these four regions are not electrically connected to one another, this allows for separate selection of NAND strings in each region (similar to the drain select layers). FIG. 4C2 depicts one embodiment in which layers SGS0, SGS1, SGS2, DWLL1, WLL0-WLL31, and DWLL2 (as well as SGD0, SGD1, and SGD2) are divided into four regions.

Note that the two (or more) regions at a given source side select gate layer are not electrically connected to one another, in one embodiment. This allows for separate selection of NAND strings in the two (or more) regions. However, there could be an electrical short between two (or more) adjacent regions. Referring to FIG. 4C2, there might be an electrical short between region 423 and 424; regions 425 and 426; regions 443 and 444; regions 445 and 446; regions 453 and 454; and/or regions 455 and 456. Other electrical shorts involving these regions are also possible. Such electrical shorts may impair memory operations. Such electrical shorts may even result in data loss due to, for example, unintentional erasure or unintentional programming. Embodiments, disclosed herein detect electrical shorts including, but not limited to, the foregoing examples.

Four select line drivers 401 are depicted in FIGS. 4C1 and 4C2. Each select line driver 401 is configured to apply a voltage to one end of one of the select lines 420, 430, 440, 450, in one embodiment. Note that select lines 421 and 422 may or may not be electrically connected to select line 420. Thus, drain side select lines 421 and 422 could have their own select line drivers (not depicted in FIGS. 4C1 and 4C2). Likewise, drain side select lines 431, 441, 451, 433, 442, 452 could have their own select line drivers. Further, there may be more than one select line driver 401 per drain side select line. For example, select line 420 may have more than one select line driver 401 that each provide the desired voltage. The select line driver 401 may respond to a control signal from state machine 112. The voltage on a select line may be floated by disconnecting the select line driver 401 from the select line.

Other conductive layers also have drivers to provide voltages thereto. Note that for word line layers, the two regions may be electrically connected (although this is not required). FIG. 4C1 shows two word line drivers 403, one each for regions 460, 462. However, regions 460 and 462 may be electrically connected, such that a single word line driver 403 may suffice. FIG. 4C2 shows an example with just one word line driver 403 for all regions at WLL1 (the electrical connection between these regions is not depicted in FIG. 4C2). Alternatively, there could be more than one word line driver per region. For example, region 460 could have two or more word line drivers.

Drivers are not depicted in FIGS. 4C1 and 4C2 for SGS0, SGS1, SGS2, DWLL1, WLL0, WLL28-WLL31, DWLL2, SGD0, and SGD1. However, those layers may also have drivers to provide voltages thereto.

FIG. 4D1 depicts a portion of an embodiment of three dimensional memory structure 126 showing a cross-sectional view along line BB of FIG. 4A. Only the upper layers are depicted. One word line layer WLL31, one dummy word line layer DWL2, and three select gate layers SGD0, SGD1, and SGD2 are depicted. FIG. 4D1 is consistent with FIG. 4B. The upper portions of columns 435 and 436 are depicted.

In one embodiment, the vertical columns are round and include four layers; however, in other embodiments more or fewer than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density. Surrounding charge trapping layer 473 a blocking oxide ($SiO_2$) layer 478.

FIG. 4D1 depicts dielectric layers DLL36, DLL37, DLL38, DLL39 and DLL40, as well as word line layer WLL31, dummy word line layer DWL2, and drain side select gate layers SGD0, SGD1, and SGD2. The word line layer WLL31 includes a word line region 476 surrounded by an aluminum oxide layer 477. Similarly, the dummy word line layer DWL2 includes a word line region 476 surrounded by an aluminum oxide layer 477.

The drain side select gate layers SGD0, SGD1, and SGD2 each include a select gate line region 479 surrounded by an aluminum oxide layer 477. There are two distinct select gate lines represented in FIG. 4D1. One select gate line is labeled 479a, the other 479b. Select gate separator 404 physically divides the two select gate lines 479a, 479b. Thus, select gate separator 404 provides electrical isolation between select gate line 479a and select gate line 479b. Note that the select gate lines 479a at the different layers (e.g., SGD0, SGD1, SGD2) may or may not be electrically connected to each other. Likewise, the select gate lines 479b at the different layers (e.g., SGD0, SGD1, SGD2) may or may not be electrically connected to each other.

The physical interaction of the word line layers with the vertical column forms the memory cells. Thus, a memory cell comprises channel 471, tunneling dielectric 472, charge trapping layer 473, blocking oxide layer 478, aluminum oxide layer 477 and word line region 476. A portion of the word line region 476 that is adjacent to the blocking oxide layer 478 serves as the memory cell control gate. For example, word line layer WLL31 and a portion of vertical column 435 comprise a memory cell MC1; word line layer WLL31 and a portion of vertical column 436 comprise a memory cell MC2. Dummy memory cells are formed at dummy word line layer DWL2 in a similar manner.

Six select transistors are depicted: ST0A, ST1A, ST2A, ST0B, ST1B, and ST2B. The select transistors comprise similar material as the memory cells. Thus, a select transistor cell comprises channel 471, tunneling dielectric 472, charge trapping layer 473, blocking oxide layer 478, aluminum oxide layer 477 and a portion of select gate line 479. A portion of the select gate line 479 that is adjacent to the blocking oxide layer 478 serves as the select transistor control gate. For example, a portion of select gate line 479a at layer SGD0 and a portion of vertical column 435 comprise a select transistor ST0A; a portion of select gate line 479a at layer SGD1 and a portion of vertical column 435 comprise a select transistor ST1A; a portion of select gate line 479a at layer SGD2 and a portion of vertical column 435 comprise a select transistor ST2A; a portion of select gate line 479b at layer SGD0 and a portion of vertical column 436 comprise a select transistor ST0B; a portion of select gate line 479b at layer SGD1 and a portion of vertical column 436 comprise a select transistor ST1B; and a portion of select gate line 479b at layer SGD2 and a portion of vertical column 436 comprise a select transistor ST2B.

In other embodiments, the aluminum oxide layer 477 is within the vertical column 432 between the blocking oxide layer 478 and the word line region 476. In other embodiments, both the blocking oxide layer 478 and the aluminum oxide layer 477 are outside of the vertical column 432. In this example, the same order of charge trapping layer 473, blocking oxide layer 478, and aluminum oxide layer 477 may be used. There may be a titanium nitride layer between the aluminum oxide layer 477 and the word line region 476. However, this is not depicted in FIG. 4D1.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel. In another erase operation embodiment, holes can be injected and recombine with the stored electrons in the charge trap layer.

In a similar manner, the threshold voltage of a select transistor may be established by the amount of stored charge in charge trapping layer 473. The terms programming and erasing a select transistor are used herein in a similar manner as programming or erasing a memory cell. Erasing a select transistor lowers the threshold voltage of the select transistor to below some target level, in one embodiment. Programming a select transistor increases the threshold voltage of the select transistor to above some target level, in one embodiment.

As noted above, select gate separator 404 may be formed from an insulator which is intended to provide electrical isolation between two adjacent select lines. An electrical short 498 is represented between a portion of select gate line 479a and a portion of select gate line 479b at layer SGD1. Thus, the electrical short 498 represents an electrical short between two adjacent drain side select lines. Since the portion of the select gate line 479a or 479b that is adjacent to a memory column (e.g., 435 or 436) may serve as the control gate of the drain side select transistor, the electrical short 498 forms an electrical short between the control gate of drain side select transistor ST1A and the control gate of drain side select transistor ST1B. Although not depicted in FIG. 4D1, an electrical short might also form in the select gate separator 404 at the other drain side select gate layers (e.g., SGD0 and/or SGD2).

One possible cause of the electrical short 498 is under-etching of a trench in which the select gate separator 404 is formed. For example, after forming the conductive material for the select lines, a trench may be formed to separate the conductive material into two adjacent select lines. Then, the trench may be filled with an insulator, such as silicon oxide, to form the select gate separator 404. If the trench does not reach all of the way to dielectric layer DLL37 this may lead to an electrical short. Thus, the electrical short 498 might arise to the absence, or partial absence, of the select gate separator 404 between the conductive material for two adjacent select lines. Another possible reason for the electrical short 498 is for the select gate separator 404 to have some sort of a defect. For example, rather than the select gate separator 404 being formed from purely an insulator, there could be a material within the select gate separator 404 that allows conduction of current across the select gate separator 404. However, the electrical short 498 could arise due to other reasons.

Note that an electrical short could also form between source side select lines. FIG. 4D2 is a diagram one embodiment of a portion of three dimensional memory structure 126. This is for the same cross-sectional view along line BB of FIG. 4A as FIG. 4A. However, only the lower layers are depicted. Also, this is for an embodiment in which the source side select gates are divided into four regions. One word line layer WLL0, one dummy word line layer DWL1, and three select gate layers SGS0, SGS1, and SGS2 are depicted. FIG. 4D2 is consistent with FIG. 4C2. Note that only the lower portions of columns 435 and 436 are depicted.

FIG. 4D2 depicts dielectric layers DLL0, DLL1, DLL2, DLL3 and DLL4, as well as word line layer WLL0, dummy word line layer DWL1, and source side select gate layers SGS0, SGS1, and SGS2. The word line layer WLL0 includes a word line region 476 surrounded by an aluminum oxide layer 477. Similarly, the dummy word line layer DWL1 includes a word line region 476 surrounded by an aluminum oxide layer 477. WLL0 may be similar to WLL31 described in connection with FIG. 4D1. Likewise, DWL1 may be similar to DWL2 described in connection with FIG. 4D1.

The source side select gate layers SGS0, SGS1, and SGS2 each include a select gate line region 479 surrounded by an aluminum oxide layer 477. There are two distinct select gate lines represented in FIG. 4D2. One select gate line is labeled 479c, the other 479d. Select gate separator 404 physically divides the two select gate lines 479c, 479d. Thus, select gate separator 404 provides electrical isolation between select gate line 479c and select gate line 479d. Note that the select gate lines 479c at the different layers (e.g., SGS0, SGS1, SGS2) may or may not be electrically connected to each other. Likewise, the select gate lines 479d at the different layers (e.g., SGS0, SGS1, SGS2) may or may not be electrically connected to each other.

Six source side select transistors are depicted: ST0C, ST1C, ST2C, ST0D, ST1D, and ST2D. The source side select transistors comprise similar material as the memory cells. Thus, a source side select transistor cell comprises channel 471, tunneling dielectric 472, charge trapping layer 473, blocking oxide layer 478, aluminum oxide layer 477 and a portion of select gate line 479. A portion of the select gate line 479 that is adjacent to the blocking oxide layer 478 serves as the control gate of the source side select transistor. For example, a portion of source side select gate line 479C at layer SGS0 and a portion of vertical column 435 comprise a source side select transistor ST0C; a portion of source side select gate line 479c at layer SGS1 and a portion of vertical column 435 comprise a source side select transistor ST1C; a portion of source side select gate line 479c at layer SGS2 and a portion of vertical column 435 comprise a source side select transistor ST2C; a portion of source side select gate line 479d at layer SGS0 and a portion of vertical column 436 comprise a source side select transistor ST0D; a portion of source side select gate line 479d at layer SGS1 and a portion of vertical column 436 comprise a source side select transistor ST1D; and a portion of source side select gate line 479d at layer SGS2 and a portion of vertical column 436 comprise a source side select transistor ST2D.

Select gate separator 404 may be formed from an insulator which is intended to provide electrical isolation between two adjacent source side select lines. An electrical short 498 is represented between a portion of select gate line 479c and a portion of select gate line 479c at layer SGS1. Thus, the electrical short 498 represents an electrical short between two adjacent source side select lines. Since the portion of the source side select gate line 479c or 479d that is adjacent to a memory column (e.g., 435 or 436) may serve as the control gate of the source side select transistor, the electrical short 498 forms an electrical short between the control gate of source side select transistor ST1C and the control gate of source side select transistor ST1D. Although not depicted in FIG. 4D2, an electrical short might also form in the select gate separator 404 at the other source side select gate layers (e.g., SGS0 and/or SGS2).

Yet another type of electrical short that may form is a select line-bit line contact-select line electrical short. Such an electrical short can arise as a result of a mis-aligned bit line contact. FIGS. 4D3 and 4D4 depict one example of such an electrical short for one embodiment of a memory structure. FIG. 4D3 is a block diagram depicting a top view of a portion of one block from memory structure 126. The portion of the block depicted in FIG. 4D3 corresponds to regions 420 and 430 in FIG. 3. Region 420 corresponds to one drain side select line, and region 430 corresponds to an adjacent drain side select line. One of the bit lines 414 is represented. Bit line 414 is intended to have a bit line contact down to each of vertical columns 432 and 436. Note that FIG. 4B shows one example of correctly aligned bit line contact 415a from bit line 414 to vertical column 434 and bit line contact 415b from bit line 414 to vertical column 438. Different reference numerals are used for the bit line contacts in FIG. 4D3 because at least one of the bit line contacts is mis-aligned. The two bit line contacts are labeled 492 and 496 in FIG. 4D3.

FIG. 4D4 depicts a portion of the three dimensional memory structure of FIG. 4D3 showing a cross-sectional view along the bit line 414 FIG. 4D3. This cross sectional view cuts through vertical columns 432, 434, 436, and 438; regions 420 and 430; local interconnects 402, 406; and select gate separator 404. Bit line contact 496 is shown as being mis-aligned. Bit line contact 496 was intended to form a contact between the bit line 414 and vertical column 436. Note that to form the bit line contact 496, some of the vertical column may be etched. For example, layer DL40 and at least a portion of layer SGD2 may be etched to form a hole in which to form the bit line contact 496. However, the mis-alignment of bit line contact 496 creates an electrical short between region 420 and region 430. Specifically, the electrical short goes from region 420 to the bit line contact 496 to region 430. Thus, the mis-alignment of bit line contact 496 creates an electrical short between the select gate line formed by region 420 and the select gate line formed by region 430.

Figure 5:
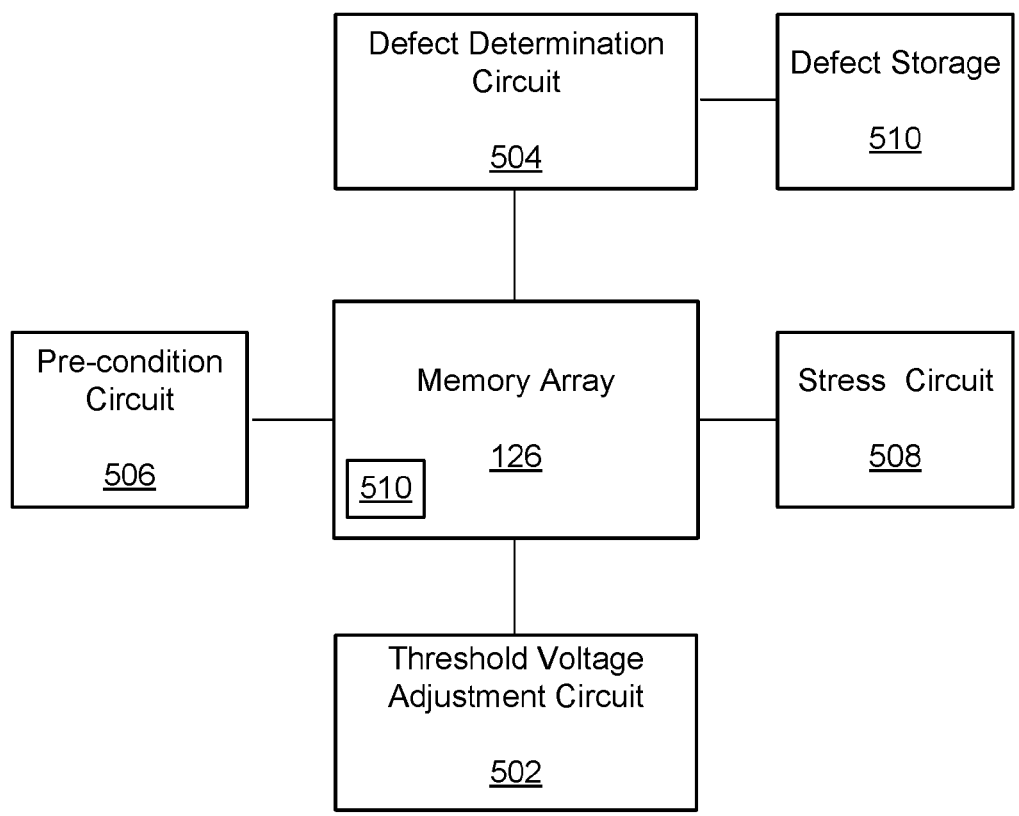
FIG. 5 is a block diagram of one embodiment of an apparatus that is configured to detect defects of adjacent select lines.

FIG. 5 is a block diagram of one embodiment of an apparatus 500. The apparatus is configured to detect defects of adjacent select lines, in one embodiment. The two adjacent select lines will be referred to as first and second select lines. In one embodiment, the first and second select lines are adjacent to each other in a three-dimensional memory array. The first and second select lines are at the same level of the three-dimensional memory array, in one embodiment. This may be referred to herein as being "horizontally adjacent". As one example, the first and second select lines are both at level SGD2. As one example, the first and second select lines are both at level SGS0.

The apparatus comprises a memory array 126, a threshold voltage (Vth) adjustment circuit 502, a defect determination circuit 504, a pre-condition circuit 506, a stress circuit 508, and defect storage 510.

In one embodiment, the memory array 126 is a three dimensional memory array such as, but not limited to, the memory array described with respect to FIG. 2. The memory array 126 comprises NAND strings, in one embodiment. The NAND strings have memory cells and select transistors, in one embodiment.

The apparatus is configured to determine whether an electrical short exists between two adjacent drain side select lines, in one embodiment. As one example of adjacent drain select lines, the first select line is formed by region 420 and the second select line is formed by region 430 (see FIGS. 4A, 4C1, 4C2). The apparatus is configured to determine whether an electrical short exists between two adjacent source side select lines, in one embodiment. As one example of adjacent source select lines, the first select line is formed by region 423 and the second select line is formed by region 424 (see FIG. 4C2).

In one embodiment, the apparatus is configured to detect a defect of adjacent select transistors. These adjacent select transistors may be in a three dimensional memory array. The apparatus is configured to determine whether an electrical short exists between a gate of a first select transistor and a gate of an adjacent second select transistor, in one embodiment. The first select transistor may be part of a first vertical column that is connected to a first select gate line associated with the first vertical column. The second select transistor may be part of a second vertical column that is connected to a second select gate line associated with the second vertical column. Each vertical column could form a NAND string. Thus, the first select transistor may be part of a first NAND string that is connected to a first select gate line associated with the first NAND string. The second select transistor may be part of a second NAND string that is connected to a second select gate line associated with the second NAND string, in one embodiment. The first and second select transistors are both drain side select transistors, in one embodiment. As one example, the first select transistor is ST0A and the second select transistor is ST0B (see FIG. 4D1). The first and second select transistors are both source side select transistors, in one embodiment. As one example, the first select transistor is ST2C and the second select transistor is ST2D (see FIG. 4D2). The adjacent select transistors may be at different levels of the three dimensional memory array. As one example, the first select transistor is ST2A and the second select transistor is ST1A (see FIG. 4D1). As another example, the first select transistor is ST2C and the second select transistor is ST1C (see FIG. 4D2). The first and second select transistors are not limited to these examples.

The threshold voltage adjustment circuit 502 is configured to perform an operation configured to change a threshold voltage of the first select transistor and configured to maintain a threshold voltage of the second select transistor that is adjacent to the first select transistor, in one embodiment. The threshold voltage adjustment circuit 502 is configured to perform an operation configured to change a threshold voltage distribution of first select transistors connected to a first select line and configured to maintain a threshold voltage distribution of second select transistors connected to a second select line that is adjacent to the first select line, in one embodiment.

In one embodiment, the operation configured to change the threshold voltage is an erase operation. In one embodiment, the threshold voltage adjustment circuit 502 is configured to apply an erase enable voltage to a gate of the first select transistor while attempting to float the voltage at a gate of the second select transistor. The erase enable voltage is intended to change (e.g., lower) the threshold voltage of the first select transistor. Floating the voltage at the gate of the second select transistor is intended to maintain the threshold voltage of the second select transistor. However, if an electrical short exists between the gate of the first select transistor and the gate of the second select transistor, then instead of the voltage floating at the gate of the second select transistor, the voltage at the gate of the second select transistor may be at or close to the erase voltage. This may result in a change (e.g., lowering) of the threshold voltage of the second select transistor.

In one embodiment, the operation configured to change the threshold voltage of the first select transistor is a program operation. In one embodiment, the threshold voltage adjustment circuit 502 is configured to apply a program voltage to a gate of the first select transistor while applying a voltage that is less than the program voltage to a gate of the second select transistor. An example of a voltage that is less than the program voltage is ground or close to ground. If there is an electrical short between the gate of the first select transistor and the gate of the second select transistor, then the voltage on the gate of the first select transistor may fail to reach the intended program voltage. This may cause the program operation of the first select transistor to fail.

In one embodiment, the threshold voltage adjustment circuit 502 is configured to apply a program voltage to a gate of the first select transistor while attempting to float the voltage at a gate of the second select transistor. If there is an electrical short between the gate of the first select transistor and the gate of the second select transistor, then voltage on the gate of the second select transistor may be at or close to the program voltage. This may cause program disturb of the second select transistor.

Note that the erase operation and the program operation are both examples of memory operations. Also note that the operations (e.g., erase, program) may be performed on more than one select transistor connected to the first select gate line and to more than one select transistor connected to the second select line. The operations (e.g., erase, program) may be applied to any set of select transistors connected to the first and second select lines (including all of the select transistors connected to the first and second select lines).

Also note that the operations (e.g., erase, program) may be applied to select transistors at more than one level. For example, referring to FIG. 4D1, the operation that is performed on the first select transistor can be applied to drain side select transistors ST0A, ST1A, and ST2A; and the operation that is performed on the second select transistor can be applied to drain side select transistors ST0B, ST1B, and ST2B. Similar reasoning applies to the source side. Referring to FIG. 4D2, the operation that is performed on the first select transistor can be applied to source side select transistors ST0C, ST1C, and ST2C; and the operation that is performed on the second select transistor can be applied to source side select transistors ST0D, ST1D, and ST2D.

The defect determination circuit 504 is configured to flag the first select transistor and the second select transistor in response to the threshold voltage of one or more of the first select transistor and the second select transistor failing to meet a target threshold voltage in response to the operation. In one embodiment, the defect determination circuit 504 is configured to determine that an electrical short exists between the first select transistor and the second select transistor in response to the threshold voltage of either the first select transistor or the second select transistor not meeting the target threshold voltage in response to the operation.

The defect determination circuit 504 may flag the select transistors by storing information in defect storage 510. Defect storage 510 may be implemented external to the memory array 126 or within the memory array 126. Thus, only one of these options is required. Externally to the memory array, defect storage 510 could be on memory die 108 or in the controller 122 (see FIG. 2). In one embodiment, the information indicates that the block in which the first and second select transistors resides is a bad block. Thus, the information could identify the block and some status information. Alternatively, the information could identify some portion of the memory array that is less than the entire block. The information might specifically identify the first and second select lines, along with status information (e.g., status of defective, electrical short, etc.)

In one embodiment, the defect determination circuit is configured to flag the first select transistor and the second select transistor in response to the threshold voltage of the second select transistor failing to maintain the target threshold voltage in response to the operation. In one embodiment, defect determination circuit 504 flags the first select transistor and the second select transistor in response to the second select transistor suffering erase disturb. This may be used in connection with an embodiment in which the operation is to erase the first select transistor but not the second select transistor.

In one embodiment, defect determination circuit 504 flags the first select transistor and the second select transistor in response to the second select transistor suffering program disturb. This may be used in connection with an embodiment in which the operation is to program the first select transistor but not the second select transistor.

In one embodiment, the defect determination circuit 504 is configured to flag the first select transistor and the second select transistor in response to the threshold voltage of the first select transistor failing to change to the target threshold voltage in response to the operation. In one embodiment, defect determination circuit 504 flags the first select transistor and the second select transistor in response to a program operation of the first select transistor failing. This may be used in connection with an embodiment in which the operation is to program the first select transistor but not the second select transistor.

In one embodiment, the pre-condition circuit 506 is configured to establish a threshold voltage of the first and/or second select transistor prior to the operation being performed. In one embodiment, the pre-condition circuit 506 sets the threshold voltages to a target voltage or above the target voltage. In one embodiment, the pre-condition circuit 506 sets the threshold voltages to a target voltage or below the target voltage.

In one embodiment, the pre-condition circuit 506 is configured to establish a threshold voltage distribution of select transistors associated with the first select line. Likewise, the pre-condition circuit 506 is configured to establish a threshold voltage distribution of select transistors associated with the second select line. In both cases, the threshold voltage distributions may be established prior to performing the operation (by the threshold voltage adjustment circuit 502). As one example, the threshold voltage distribution has most (but not necessarily all) of the select transistors having a Vth above a target threshold voltage. As another example, the threshold voltage distribution has most (but not necessarily all) of the select transistors having a Vth below a target threshold voltage.

The stress circuit 508 is configured to apply a first stress voltage to a gate of the first select transistor while applying a second stress voltage to a gate of the second select transistor prior to performing the operation. The first and second stress voltages have different magnitudes.

In one embodiment, the stress circuit 508 is configured to alternate between: i) applying a high magnitude stress voltage to the gate of the first select transistor while applying a low magnitude stress voltage to the gate of the second select transistor; and ii) applying a low magnitude stress voltage to the gate of the first select transistor while applying a high magnitude stress voltage to the gate of the second select transistor.

The threshold voltage adjustment circuit 502, the pre-condition circuit 506, the defect determination circuit 504, and the stress circuit 508 may be implemented by any combination of control circuitry 110, state machine 112, code/parameters 113, power control 116, read/write circuits 128, Sense Block SB1 . . . SBp, Controller 122, processor 122*c*, ROM 122*a*, RAM 122*b*, and/or other hardware. Other embodiments may include other hardware and/or software for implementing threshold voltage adjustment circuit 502, the pre-condition circuit 506, the defect determination circuit 504, and the stress circuit 508.

FIG. 6 is a flowchart of one embodiment of a process 600 for determining whether an electrical short exists between two adjacent select lines. The process 600 may be performed by apparatus 500. The process 600 involves a first set of select transistors connected to a first select line and a second set of select transistors connected to a second select line that is adjacent (e.g., horizontally adjacent) the first select line in a three-dimensional memory array. As one example, the first select line is region 420 and the second select line is region 430 (see FIGS. 4A, 4C1, 4C2). In this case, the set of select transistors may be any or all of the select transistors in one of the aforementioned regions 420, 430. As another example, the first select line is region 440 and the second select line is region 450 (see FIG. 4C1). As still another example, the first select line is region 423 and the second select line is region 424 in FIG. 4C2. Many other possibilities exist. Note that for some architectures, there is more than one select gate layer. Each select gate layer may have adjacent select gate lines. For example, in FIG. 4C1, select gate layer SGD1 has drain side select line 421, drain side select line 431, drain side select line 441, and drain side select line 451. Similarly, select gate layer SGD0 has drain side select line 422, drain side select line 432, drain side select line 442, and drain side select line 452.

In step 602, an operation configured to change threshold voltages of a first set of select transistors and to maintain threshold voltages of a second set of select transistors is performed. In one embodiment, the operation is an erase operation. In one embodiment, the operation is a program operation.

In step 604, a determination is made that an electrical short exists between the first select line and the second select line in response to the threshold voltages of either the first set of select transistors or the second set of select transistors failing to meet a target threshold voltage in response to the operation.

In step 604, the defect determination circuit 504 may store information that identifies the first select line and the second select line and some status information. Rather than identifying the first select line and the second select line, the information might simply identify the block in which the first select line and the second select line reside. The status information may indicate that the block (or select lines) should not be used, or that special care must be taken when using the block (or select lines), as examples.

Note that step 604 is one special case of determining that a defect exists with respect to the two adjacent select lines. The process 600 can be generalized to determining that a defect exists with respect to the two adjacent select lines in response to the threshold voltages of either the first set of select transistors or the second set of select transistors failing to meet a target threshold voltage in response to the operation.

Figure 7A:
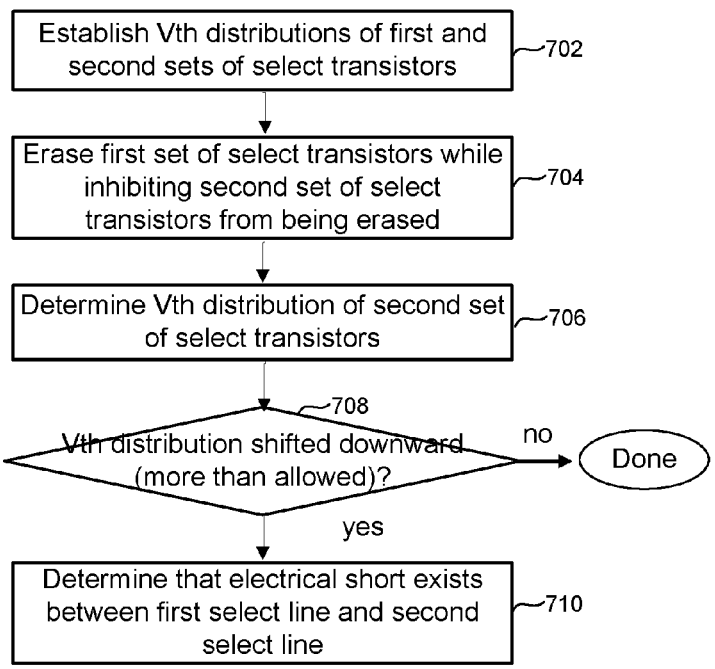
FIG. 7A is a flowchart of one embodiment of a process that uses an erase operation to determine whether an electrical short exists between adjacent select lines.

FIG. 7A is a flowchart of one embodiment of a process 700 that uses an erase operation to determine whether an electrical short exists between adjacent select lines. The process 700 is one embodiment of the process 600 of FIG. 6.

Figure 7B:
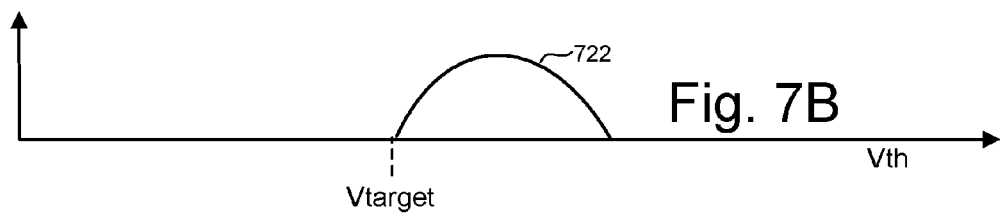
FIG. 7B, FIG. 7C, and FIG. 7D depict example Vth distributions.

In step 702, Vth distributions are established for the first set of transistors connected to the first select line and the second set of transistors connected to the second select line. FIG. 7B depicts an example Vth distribution 722 that may be used for both the first and second sets of transistors. In this example, Vth distribution 722 is above Vtarget. Note that up to a certain number of select transistors could have a Vth below Vtarget. Thus, it is not required that every select transistor have a Vth above Vtarget. Step 702 may be performed by the pre-condition circuit 506.

Figure 7C:
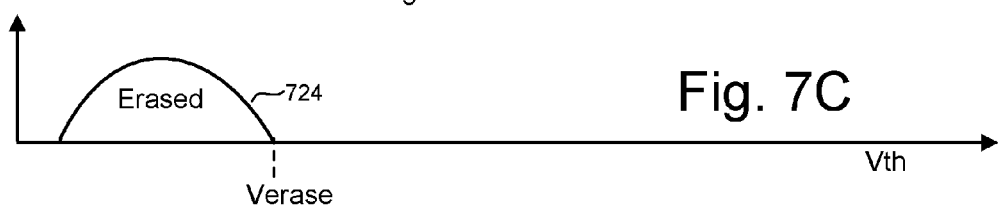
Figure 7D:
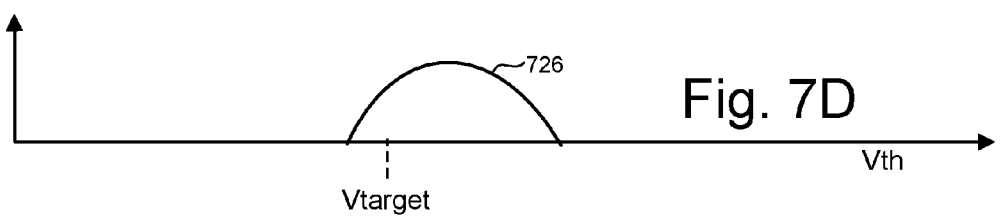
Figure 7E:
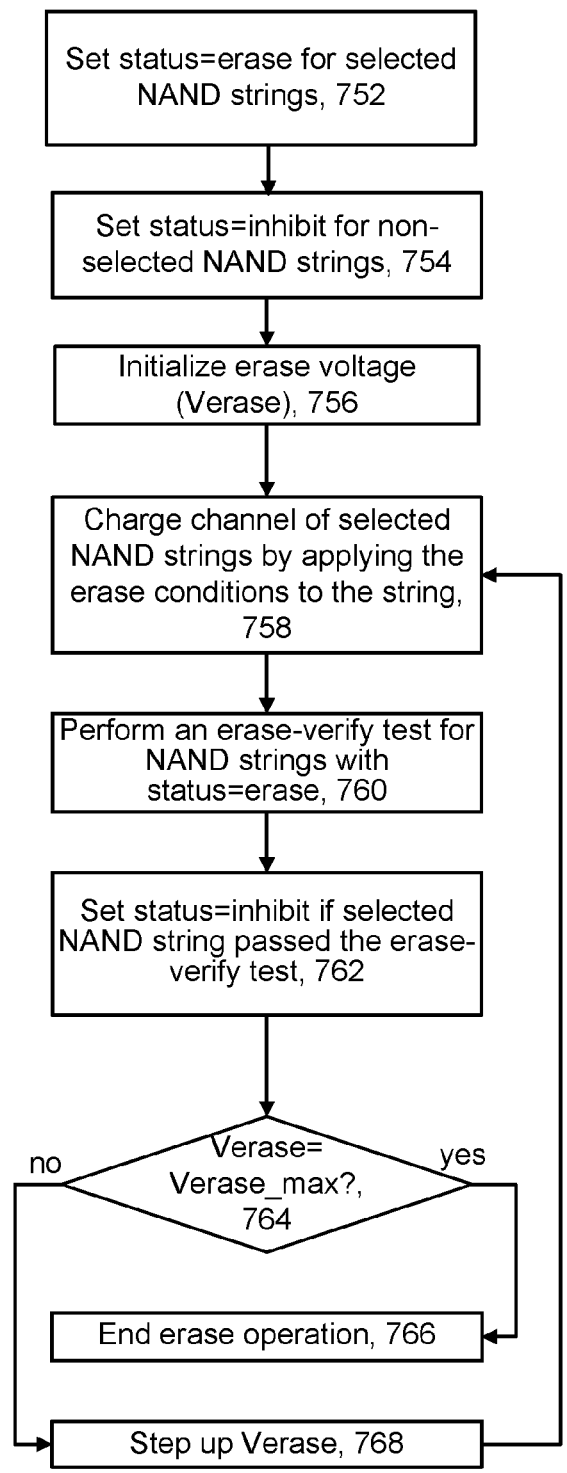
FIG. 7E provides further details for one embodiment of a process of erasing select transistors.

In step 704, the first set of select transistors are erased while the second set of select transistors are inhibited from being erased. FIG. 7C shows an example Vth distribution 724 for the first set of select transistors after the erase operation. The Vth distribution 724 is now below Verase. Note that up to a certain number of select transistors could have a Vth above Verase. Thus, it is not required that every select transistor have a Vth below Verase. Further details of one embodiment of step 704 are depicted in FIG. 7E.

In step 706, a Vth distribution of the second set of select transistors is determined. If there is an electrical short between the first select line and the second select line, this may cause erase disturb of the second set of select transistors. FIG. 7D shows an example Vth distribution 726 of the second set of select transistors showing erase disturb. Note that a significant portion of the Vth distribution 726 is now below Vtarget. The lower portion of the Vth distribution 726 is referred to as the lower tail. In FIG. 7D, the lower tail is below Vtarget. In one embodiment, the lower tail is defined based on a certain number of transistors. For example, a certain number of transistors may be allowed to have a Vth below the lower tail.

In step 708, a determination is made whether the Vth distribution has shifted down by more than an allowed amount. In one embodiment, the defect determination circuit 504 determines whether more than an allowed number of select transistors have a threshold voltage below Vtarget. If so, then the Vth distribution is characterized is having shifted downward by more than an allowed amount.

In response to this downward shift (by more than the allowed amount), the defect determination circuit 504 determines that an electrical short exists between the first select line and the second select line in step 708. Otherwise, the process 700 concludes without performing step 710.

FIG. 7E provides further details for one embodiment of a process 750 of erasing select transistors. The process 750 may be used to erase select transistors associated with a first select line while inhibiting select transistors associated with a second select line from being erased. The process 750 is one embodiment of step 704 from FIG. 7A. The process 750 may be used for erasing just the select transistors (and not the memory cells on those NAND strings). The process 750 could also be used for erasing the entire NAND string. That is, memory cells could be erased along with the select transistors.

Generally, an erase operation can include multiple erase-verify iterations which are performed until a verify condition is met, at which point the erase operation ends. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors may generate a sufficient amount of gate-induced drain leakage (GIDL) current to charge up the floating body (channel) of the NAND string. Note that GIDL also depends on the select line voltage, as the select line is connected to the gate of the select transistors. GIDL increases in proportion to the drain-to-gate voltage (Vdg) of the select gate transistors.

Step 752 sets status=erase for the NAND strings that are selected for erase. For example, NAND strings in region 420 may be selected for erase. During the process, as NAND strings in region 420 pass erase, their status may be set to "inhibit". Note that status data can be maintained indicating whether the string has a status of "inhibited," which indicates that the string is to be inhibited from further erasing in the erase portion of a successive erase iteration of the erase operation, or a status of "uninhibited," which indicates that the string is not to be inhibited from further erasing in the erase portion of a successive erase iteration of the erase operation (that is, the string is to continue to undergo erasing). The status data can be maintained by the on-chip control circuitry 110 or the off-chip controller 122, for instance, and updated based on results of a verify test of each erase iteration.

Step 754 sets status=inhibit for the non-selected NAND strings. For example, referring NAND strings in region 430 may be non-selected. Note that some of the non-selected NAND strings are connected to a bit line that may receive the erase voltage. Thus, to prevent these NAND strings from being erased, the second select line may be floated. Floating the select line may prevent GIDL generation. Thus, floating the select line prevents charging the unselected channels.

Step 756 initializes an erase voltage (Verase) to a starting value. Recall that this is the voltage that is applied to the bit lines.

Step 758 charges the channel of the selected NAND strings by applying the erase conditions. Step 758 includes applying the erase voltage to the string. Suitable voltages are also applied to select lines and word lines to either encourage or inhibit erase. In one embodiment, the voltage to the first select line is set to a voltage to encourage erasing. The voltage applied to the first select line will be referred to as an erase enable voltage. This voltage generates GIDL at the select transistor based on the Vdg voltage of the select transistor.

In one embodiment, the voltage to the second select line is floated to inhibit erasing. At least the threshold adjustment circuit 502 attempts to float the second select line. However, if there is an electrical short between the first select line and the second select line, the erase enable voltage (or some fraction thereof) may arise on the second select line. This may cause erase disturb on the NAND strings connected to the second select line.

Step 760 is an erase-verify test. In one embodiment, this erase-verify is for just the select transistors. Thus, the erase-verify can apply an erase-verify control gate voltage (e.g., Verase) to the control gate of each select transistor while detecting the current through the string. In this option, a voltage can be applied to the control gates of the memory cells that is above the Vth of the memory cells, such that the memory cells will conduct a current.

Another option is to erase both the select transistors and the memory cells at the same time. In this option, a suitable erase-verify control gate voltage may be applied to the control gate of each storage element and to the control gates of select transistors while detecting the current through the string.

If the current of the string is above a reference current, indicating the string is conductive, the erase-verify test is passed. Step 762 sets status=inhibit if the selected NAND string passed the erase-verify test. The erase status=erase is continued if the selected NAND string does not pass the erase-verify test.

Decision step 764 determines if Verase is at Verase_max. If the answer is "yes," the erase operation ends unsuccessfully at step 766. If the answer is "no," Verase is stepped up at step 768 and another iteration is performed at step 758.

FIG. 8A is a flowchart of one embodiment of a process 800 that uses a program operation when determining whether an electrical short exists between adjacent select lines. The process 800 is one embodiment of the process 600 of FIG. 6. In step 802, Vth distributions of the first and second sets of select transistors are established. As one example, both the first and second sets of select transistors could be erased to distribution 724 in the example of FIG. 7C. Optionally, only the first set of select transistors are erased.

In step 804, the first set of select transistors are programmed while the second set of select transistors are inhibited from programming. In one embodiment, step 804 includes applying a programming voltage to the first select line while applying less than the programming voltage to the second select line. The voltage that is less than the programming voltage is ground, in one embodiment. The voltage that is less than the programming voltage is slightly above ground, in one embodiment. Note that the attempt to program the first set of transistors may fail.

In step 806, a determination is made whether the programming of the first set of select transistors passed. If there is an electrical short between the first select line and the second select line, then the lower voltage that is applied to the second select line may bring down the programming voltage on the first select line. This lowering of the programming voltage may cause the programming operation to fail.

In step 808, the defect determination circuit 504 determines that there is an electrical short between the first select line and the second select line responsive to the program operation failing. On the other hand, if the program operation passes, then the process 800 ends without performing step 808.

FIG. 8B is a flowchart of one embodiment of a process 850 of determining whether an electrical short exists between adjacent select lines that involves using a program operation. Process 850 may be used to detect an electrical short of the nature depicted in FIGS. 4D3 and 4D4. For example, process 850 may be used to detect a select line/bit line contact/select line short. However, the process 850 may also detect other types of electrical shorts.

The process 850 is one embodiment of the process 600 of FIG. 6. In step 852, Vth distributions of the first and second sets of select transistors are established. As one example, both the first and second sets of select transistors could be erased to a Vth distribution such as the example Vth distribution 724 of FIG. 7C. Optionally, only the first set of select transistors are erased.

In step 854, the first set of select transistors are programmed while the second set of select transistors are inhibited from programming. In one embodiment, step 854 includes programming (or at least attempting to program) a different data value into the first and second sets of select transistors. For example, the erase state (e.g., Vth distribution 724, FIG. 7C) may be considered to be a "1", whereas a programmed state (e.g., Vth distribution 722, FIG. 7B) may be considered to be a "0". Of course, these values could be reversed. Programming the first set of select transistors may be accomplished by moving the Vth distribution from Vth distribution 724 to Vth distribution 722, as one example. Inhibiting the second set of select transistors from programming may be accomplished by maintaining the Vth distribution at Vth distribution 724. Stated another way, the first set of select transistors are programmed to "1", whereas the second set of select transistors are programmed to "0". Note that in step 854 the attempt to inhibit the second set of transistors from programming may fail.

In one embodiment, step 854 includes applying a program enable voltage to a bit line. For example, a program enable voltage may be applied to bit line 414 (see FIG. 4A, 4B, 4D3, 4D4). Also, a suitable voltage may be applied to the first select line to enable programming while applying a suitable voltage to the second select line to inhibit programming. For example, a programming voltage may be applied to the first select line while floating the voltage at the second select line. However, if there is an electrical short such as depicted in FIGS. 4D3 and 4D4, then the actual voltage at the gates of the second select transistors might not be floating. It is possible for the voltage at the gates of the second set of select transistors to be high enough to result in program disturb (e.g., inadvertent programming).

In step 856, a determination is made whether the Vth distribution of the second set of select transistors indicates program disturb. If there is an electrical short between the first select line and the second select line, then the program voltage that is applied to the first select line may increase the voltage on the second select line. This increasing of the voltage may cause program disturb. FIG. 8C depicts an example Vth distribution 860 showing program disturb. This assumes that the second set of select transistors were at Vth distribution 724 before the program operation of step 854. In one embodiment, the defect determination circuit 504 allows a certain number of select transistors to have a Vth above Verase without concluding that an electrical short exists. Note that even prior to the program operation, some of the select transistors could have a Vth above Verase.

In step 858, the defect determination circuit determines that there is an electrical short between the first select line and the second select line responsive to the program disturb of the second set of select transistors.

On the other hand, if there is not a sufficient degree of program disturb of the second set of select transistors, then the process 850 ends without performing step 858.

Figure 9A:
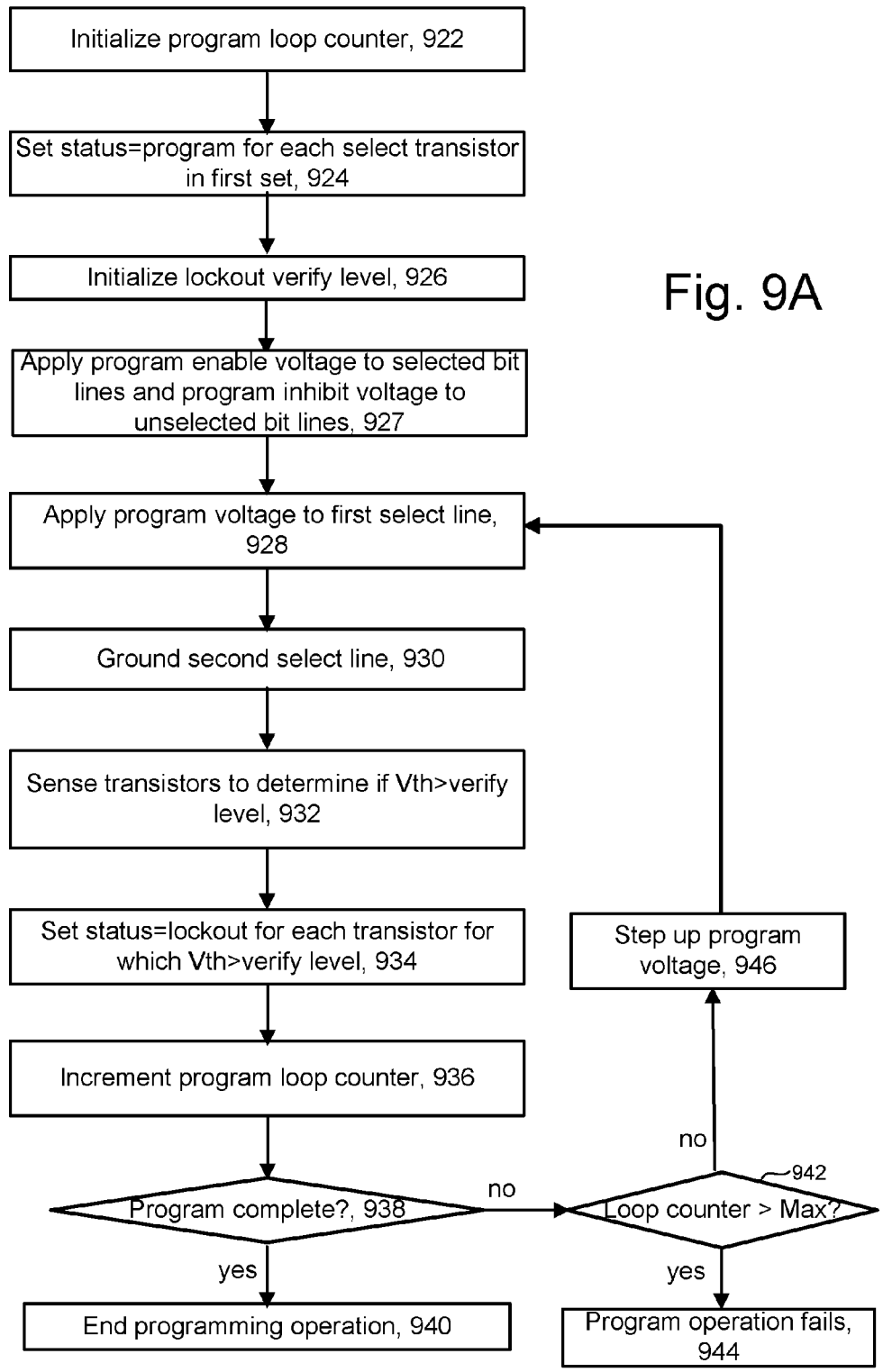
FIG. 9A and FIG. 9B depict embodiments of programming operations for select transistors.

FIG. 9A depicts an example of a programming operation for select transistors. This is one embodiment of step 804 of FIG. 8A. Step 922 initializes a program loop counter. Step 924 sets a status=program for each select transistor to be programmed. In one embodiment, initially status=program for each of the select transistors associated with the first select line.

Step 926 initializes a lockout verify level. For example, referring to FIG. 7B, the lockout verify levels can be initialized as Vtarget.

Step 927 applies a program enable voltage to selected bit lines and a program inhibit voltage to unselected bit lines. In one embodiment, the program enable voltage is 0V and the program inhibit voltage is 8-10V. Other voltages could be used.

Step 928 is to apply a program voltage to the first select line. For example, a select line driver 401 applies the program voltage to one end of the first select line. The program voltage could be applied at more than one point of the first select line. The program voltage could be applied to a point other than an end of the first select line. A range for the program voltage is 15-20 Volts.

The intent of step 928 is to apply the program voltage to the control gates of the select transistors in the first set. The program voltage (Vpgm) can be stepped up in each program-verify iteration by a step size ΔVpgm. During the program pulse of each program-verify iteration of the program-verify iterations for the first set of transistors, a respective drain voltage of the select transistor (e.g., Vb1) in the first set may be set at a lockout level (Vdd) for select transistors in the first set having the lockout status and at a program level (0 V) for select transistors in the first set having the program status. The program voltages and the step sizes can be different for memory cells versus the SG transistors.

Step 930 is to apply a ground voltage to the second select line. For example, a select line driver 401 applies the ground voltage to one end of the second select line. The ground voltage could be applied at more than one point of the second select line. The ground voltage could be applied to a point other than an end of the second select line. Note that the ground voltage may be applied to the second select line while the program voltage is applied to the first select line.

Step 932 represents a verify portion of a program-verify iteration, where the select transistors in the first set are sensed to determine if Vth > verify level. One approach to determining if Vth > verify level is to apply a voltage at the verify level to the control gate of the transistor and determine whether the transistor is in a non-conductive state. If the transistor is in a non-conductive state, Vth> verify level. Another approach to determining if Vth> verify level is to apply a specified voltage (different than the lockout verify level) to the control gate of the transistor and determine an amount of current that flows through the transistor. If the amount of current is less than a specified level, Vth> verify level. Step 934 sets a lockout status for each select transistor in the first set for which Vth> verify level, i.e., for each select transistor in the first set which passes the verify test.

The program loop counter is incremented in step 936. Decision step 938 determines if programming is complete. Decision step 938 may be true when all, or nearly all, of the select transistors being programmed have a lockout status. If programming is complete, the programming operation ends at step 940.

If programming is not yet complete (step 938=no), the loop counter is compared to a maximum number of allowed program-verify iterations such. The programming operation fails if it does not complete within a maximum number of program-verify iterations (step 944). Otherwise, the program voltage is stepped up in step 946. The new program voltage is then applied to the first select line in step 928.

Figure 9B:
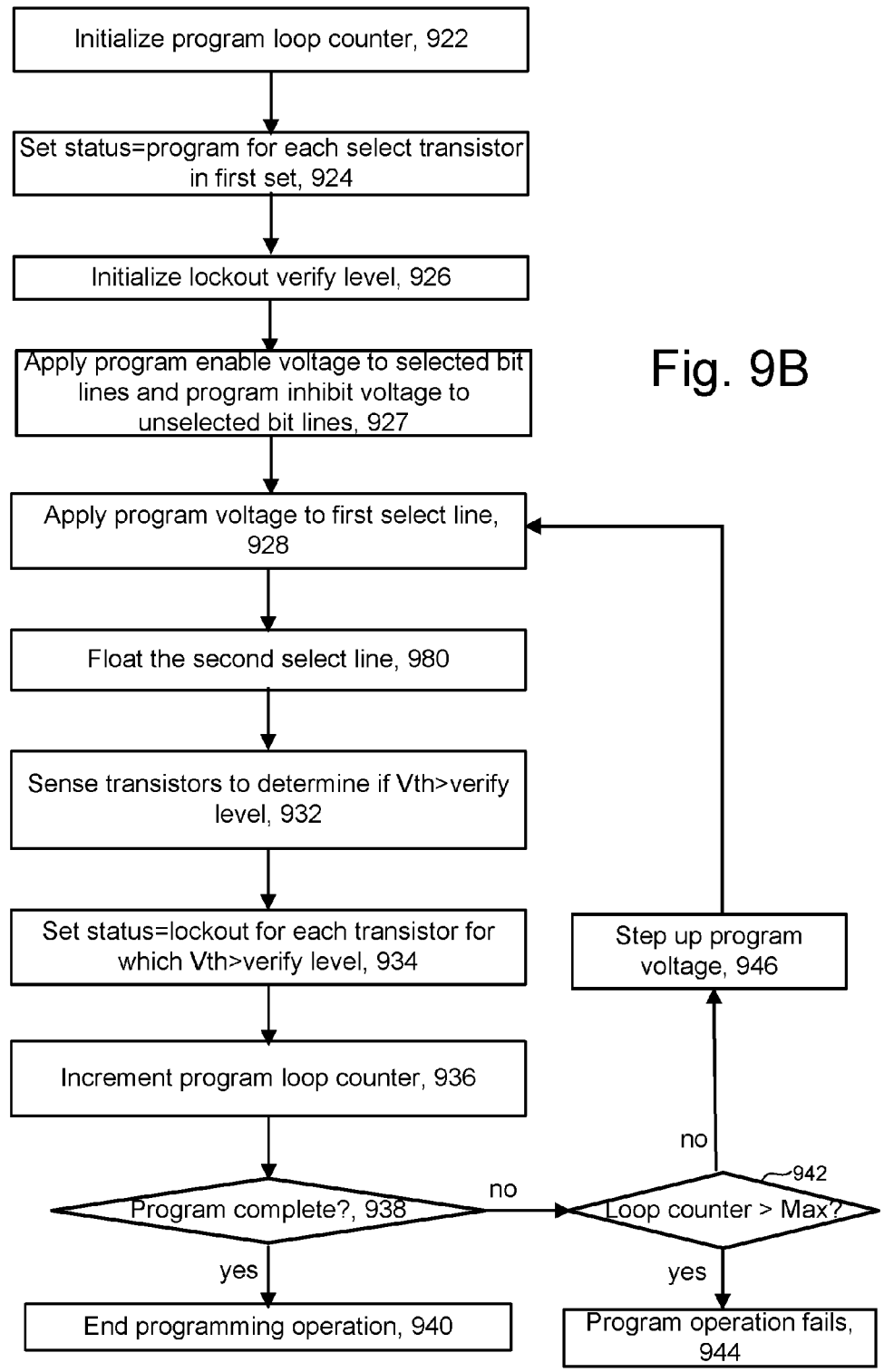

FIG. 9B depicts an example of a programming operation for memory cells. This is one embodiment of step 854 of FIG. 8B. This process is similar to the one of FIG. 9A and will not be discussed in detail. A difference is that instead of grounding the second select line, the second select line is floated. For example, a select line driver 401 is disconnected from the second select line. Note that if there is an electrical short between the first select line and the second select line, that the voltage of the second select line may be unintentionally raised. If it is raised high enough, program disturb of select transistors in the second set may occur.

Figure 10:
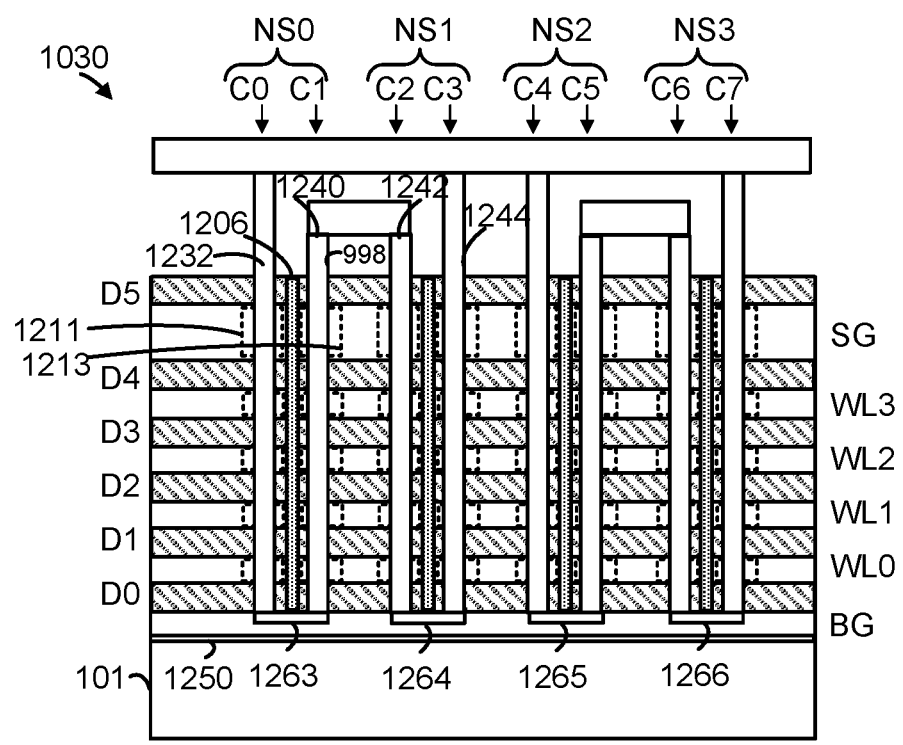
FIG. 10 depicts a cross-sectional view of one embodiment in which the NAND strings have a U-shape.

Detection of defects between select lines can be used for other architectures than discussed above. The architecture of FIG. 4B is referred to as a straight string. In one embodiment, defects are detected between adjacent select lines in a U-shaped architecture. FIG. 10 depicts a cross-sectional view of one embodiment of a U-shaped architecture, in which the NAND strings have a U-shape. The U-shaped architecture could be used in the embodiments depicted in FIGS. 1 and 2, for example.

Columns of memory cells C0 to C7 are depicted in the multi-layer stack. These columns may be similar to the vertical columns (432, 434, 436, 438) in FIG. 4B. However, in FIG. 4B each vertical column forms one NAND string. In FIG. 10, it takes two vertical columns to form one U-shaped NAND string.

The stack 1030 includes a substrate 101, an insulating film 1250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 1263 to 1266 which connect the columns. The back gate thus connects the two columns of each U-shaped NAND string. For example, NS0 (NS=NAND string) includes columns C0 and C1 and connecting portion 1263. NS0 has a drain end 1232 and a source end 1240. NS1 includes columns C2 and C3 and connecting portion 1264. NS1 has a drain end 1244 and a source end 1242. NS2 includes columns C4 and C5 and connecting portion 1265. NS3 includes columns C6 and C7 and connecting portion 1266.

The source line SL0 is connected to the source ends 1240 and 1242 of two adjacent memory strings NS0 and NS1. The source line SL0 is also connected to other sets of memory strings which are behind NS0 and NS1 in the x direction.

A slit portion 1206 is also depicted as an example. In the cross-section, multiple slit portions are seen, where each slit portion is between the drain- and source-side columns of a U-shaped NAND string. A portion of the bit line BL0 is also depicted. The slit 1206 may serves to separate select lines, in one embodiment. The slit 1206 may be formed from silicon oxide.

Short dashed lines depict memory cells and select gate transistors. One of the drain side select transistor is labeled 1211. One of the source side select transistor is labeled 1213. Note that these two select transistors are separated by slit 1206. There could be an electrical short between drain side select transistor 1211 and source side select transistor 1213. Stated another way, there could be an electrical short between the drain side select line of select transistor 1211 and the source side select line of source side select transistor 1213. Embodiments disclosed herein may be used to detect electrical shorts for U-shaped NAND strings including, but not limited to, this example. For example, the apparatus 500 in FIG. 5 may detect an electrical short between the drain side select line of select transistor 1211 and the source side select line of source side select transistor 1213.

Embodiments disclosed herein may be used to detect electrical shorts between adjacent select lines for other architectures.

A threshold voltage adjustment means for performing an operation that attempts to change threshold voltages of the select transistors of the first set of NAND strings while attempting to maintain threshold voltages of the select transistors of the second set of NAND strings, in various embodiments, may include control circuitry 110, state machine 112, code/parameters 113, power control 116, read/write circuits 128, Sense Block SB1 . . . SBp, Controller 122, processor 122c, and/or other hardware. Other embodiments may include similar or equivalent means for performing an operation that attempts to change threshold voltages of the select transistors of the first set of NAND strings while attempting to maintain threshold voltages of the select transistors of the second set of NAND strings.

A defect determination means for flagging the select transistors of the first and second sets of NAND strings when the threshold voltages of either the select transistors of the first set of NAND strings or the select transistors of the second set of NAND strings fails to meet a target threshold voltage in response to the operation in various embodiments, may include control circuitry 110, state machine 112, code/parameters 113, power control 116, read/write circuits 128, Sense Block SB1 . . . SBp, Controller 122, processor 122c, ROM 122a, RAM 122b, and/or other hardware. Other embodiments may include similar or equivalent means for flagging the select transistors of the first and second sets of NAND strings when the threshold voltages of either the select transistors of the first set of NAND strings or the select transistors of the second set of NAND strings fails to meet a target threshold voltage in response to the operation.

A pre-condition means for pre-conditioning the select transistors of the first and second sets of NAND strings in various embodiments, may include control circuitry 110, state machine 112, code/parameters 113, power control 116, read/write circuits 128, Sense Block SB1 . . . SBp, Controller 122, processor 122c, ROM 122a, RAM 122b, and/or other hardware. Other embodiments may include similar or equivalent means for flagging the select transistors of the first and second sets of NAND strings when the threshold voltages of either the select transistors of the first set of NAND strings or the select transistors of the second set of NAND strings fails to meet a target threshold voltage in response to the operation.

A stress means for applying a stress to the select transistors of the first and second sets of NAND strings in various embodiments, may include control circuitry 110, state machine 112, code/parameters 113, power control 116, read/write circuits 128, Sense Block SB1 . . . SBp, Controller 122, processor 122c, ROM 122a, RAM 122b, and/or other hardware. Other embodiments may include similar or equivalent means for flagging the select transistors of the first and second sets of NAND strings when the threshold voltages of either the select transistors of the first set of NAND strings or the select transistors of the second set of NAND strings fails to meet a target threshold voltage in response to the operation.

One embodiment disclosed herein includes an apparatus comprising a threshold voltage adjustment circuit configured to perform an operation configured to change a threshold voltage of a first select transistor and configured to maintain a threshold voltage of a second select transistor that is adjacent to the first select transistor. The apparatus further comprises a defect determination circuit configured to flag the first select transistor and the second select transistor in response to the threshold voltage of one or more of the first select transistor and the second select transistor failing to meet a target threshold voltage in response to the operation.

One embodiment disclosed herein includes a method comprising: performing an operation configured to change threshold voltages of a first set of select transistors connected to a first select line and to maintain threshold voltages of a second set of select transistors connected to a second select line that is adjacent the first select line in a three-dimensional memory array; and determining that an electrical short exists between the first select line and the second select line in response to the threshold voltages of either the first set of select transistors or the second set of select transistors failing to meet a target threshold voltage in response to the operation.

One embodiment disclosed herein includes a non-volatile storage device comprising: alternating layers of an insulating material and a conductive material, wherein the conductive material serves as word lines and also as select gate lines, and NAND strings that extend through the alternating layers of insulating material and conductive material. Each of the NAND strings comprises non-volatile storage cells and a select transistor. A group of the NAND strings has non-volatile storage cells that are each connected to the same word line, wherein a first set of the NAND strings in the group are associated with a first select gate line, wherein a second set of the NAND strings in the group are associated with a second select gate line that is adjacent to the first select gate line. The non-volatile storage device further comprises a threshold voltage adjustment means for performing an operation that attempts to change threshold voltages of the select transistors of the first set of NAND strings while attempting to maintain threshold voltages of the select transistors of the second set of NAND strings. The non-volatile storage device further comprises a defect determination means for flagging the select transistors of the first and second sets of NAND strings when the threshold voltages of either the select transistors of the first set of NAND strings or the select transistors of the second set of NAND strings fails to meet a target threshold voltage in response to the operation.

One of skill in the art will recognize that this technology is not limited to the two dimensional and three dimensional exemplary structures described but covers all relevant memory structures within the spirit and scope of the technology as described herein and as understood by one of skill in the art. The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus comprising:
   a threshold voltage adjustment circuit configured to perform an operation configured to change a threshold voltage of a first select transistor and configured to maintain a threshold voltage of a second select transistor that is adjacent to the first select transistor; and
   a defect determination circuit configured to flag the first select transistor and the second select transistor in response to the threshold voltage of one or more of the first select transistor and the second select transistor failing to meet a target threshold voltage in response to the operation.

2. The apparatus of claim 1, wherein the defect determination circuit is configured to flag the first select transistor and the second select transistor in response to the threshold voltage of the second select transistor failing to maintain the target threshold voltage in response to the operation.

3. The apparatus of claim 1, wherein the defect determination circuit is configured to flag the first select transistor and the second select transistor in response to the threshold voltage of the first select transistor failing to change to the target threshold voltage in response to the operation.

4. The apparatus of claim 1, wherein the operation comprises an erase operation of the first select transistor.

5. The apparatus of claim 4, wherein the threshold voltage adjustment circuit is configured to apply an erase enable voltage to a gate of the first select transistor while attempting to float the voltage at a gate of the second select transistor.

6. The apparatus of claim 1, wherein the operation comprises a program operation of the first select transistor.

7. The apparatus of claim 6, wherein the threshold voltage adjustment circuit is configured to apply a program voltage to a gate of the first select transistor while applying a voltage that is less than the program voltage to a gate of the second select transistor.

8. The apparatus of claim 6, wherein the threshold voltage adjustment circuit is configured to attempt to establish the threshold voltage of the first select transistor above the target threshold voltage and to maintain the threshold voltage of the second select transistor below the target threshold voltage;
   wherein the defect determination circuit is configured to flag the first select transistor and the second select transistor responsive to the second select transistor having a threshold voltage above the target threshold voltage in response to the program operation.

9. The apparatus of claim 1, further comprising:
   a stress circuit configured to apply a first stress voltage to a gate of the first select transistor while applying a second stress voltage to a gate of the second select transistor prior to performing the operation, wherein the first and second stress voltages have different magnitudes.

10. The apparatus of claim 9, wherein the stress circuit is configured to alternate between:
    i) applying a high magnitude stress voltage to the gate of the first select transistor while applying a low magnitude stress voltage to the gate of the second select transistor; and
    ii) applying a low magnitude stress voltage to the gate of the first select transistor while applying a high magnitude stress voltage to the gate of the second select transistor.

11. The apparatus of claim 1, wherein the defect determination circuit is configured to determine that an electrical short exists between the first select transistor and the second select transistor in response to the threshold voltage of either the first select transistor or the second select transistor not meeting the target threshold voltage in response to the operation.

12. The apparatus of claim 1, wherein:
    the first select transistor is connected to a first select gate line and the second select transistor is connected to a second select gate line, wherein the first select gate line is adjacent the second select gate line in a three-dimensional memory array.

13. A method comprising:
    performing an operation configured to change threshold voltages of a first set of select transistors connected to a first select line and to maintain threshold voltages of a second set of select transistors connected to a second select line that is adjacent the first select line in a three-dimensional memory array; and
    determining that an electrical short exists between the first select line and the second select line in response to the threshold voltages of either the first set of select transistors or the second set of select transistors failing to meet a target threshold voltage in response to the operation.

14. The method of claim 13, wherein performing the operation comprises performing an erase operation on the first set of select transistors while inhibiting the second set of select transistors from being erased.

15. The method of claim 14, wherein the determining that an electrical short exists comprises:
    determining that a threshold voltage distribution of the second set of select transistors has shifted downwards below the target threshold voltage in response to the erase operation on the first set of select transistors.

16. The method of claim 13, wherein performing the operation comprises performing a program operation on the first set of select transistors while inhibiting the second set of select transistors from being programmed.

17. The method of claim 16, wherein the determining that an electrical short exists comprises:
determining that the program operation on the first set of select transistors has failed; or
determining that the program operation has disturbed the threshold voltages of the second set of select transistors.

18. A non-volatile storage device comprising:
alternating layers of an insulating material and a conductive material, wherein the conductive material serves as word lines and also as select gate lines;
a plurality of NAND strings that extend through the alternating layers of insulating material and conductive material, wherein each of the NAND strings comprises non-volatile storage cells and a select transistor, wherein a group of the plurality of NAND strings has non-volatile storage cells that are each connected to the same word line, wherein a first set of the NAND strings in the group are associated with a first select gate line, wherein a second set of the NAND strings in the group are associated with a second select gate line that is adjacent to the first select gate line;
a threshold voltage adjustment means for performing an operation that attempts to change threshold voltages of the select transistors of the first set of NAND strings while attempting to maintain threshold voltages of the select transistors of the second set of NAND strings; and
a defect determination means for flagging the select transistors of the first and second sets of NAND strings when the threshold voltages of either the select transistors of the first set of NAND strings or the select transistors of the second set of NAND strings fails to meet a target threshold voltage in response to the operation.

19. The non-volatile storage device of claim 18, wherein the threshold voltage adjustment means comprises means for applying an erase enable voltage to the first select gate line while floating the second select gate line, wherein the defect determination means comprises means for determining whether a threshold voltage distribution of the select transistors of the second set of NAND strings has a lower tail below the target threshold voltage in response to the operation.

20. The non-volatile storage device of claim 18, wherein the threshold voltage adjustment means comprises means for programming the select transistors of the first set of NAND strings while not programming the select transistors of the second set of NAND strings, wherein the defect determination means comprises means for analyzing a threshold voltage distribution of either the select transistors of the first set of NAND strings or the select transistors of the second set of NAND strings in response to the programming.

* * * * *